(12) United States Patent
Makarov et al.

(10) Patent No.: US 7,060,196 B2
(45) Date of Patent: Jun. 13, 2006

(54) FIB MILLING OF COPPER OVER ORGANIC DIELECTRICS

(75) Inventors: Vladimir V. Makarov, Palo Alto, CA (US); Theodore R. Lundquist, Dublin, CA (US)

(73) Assignee: Credence Systems Corporation, Milpitas, CA (US)

( * ) Notice: Subject to any disclaimer, the term of this patent is extended or adjusted under 35 U.S.C. 154(b) by 184 days.

(21) Appl. No.: 10/678,438

(22) Filed: Oct. 3, 2003

(65) Prior Publication Data

US 2005/0072756 A1    Apr. 7, 2005

(51) Int. Cl.
*C23F 1/00* (2006.01)
*B44C 1/22* (2006.01)

(52) U.S. Cl. .................. 216/63; 216/62; 438/712; 204/192.34; 250/492.3

(58) Field of Classification Search ............... 216/62, 216/63; 204/192.34; 438/712; 250/492.3
See application file for complete search history.

(56) References Cited

U.S. PATENT DOCUMENTS

| | | |
|---|---|---|
| 5,140,164 A | 8/1992 | Talbot et al. |
| 5,336,363 A | 8/1994 | Morita |
| 5,616,921 A | 4/1997 | Talbot et al. |
| 5,700,526 A | 12/1997 | Ximen et al. |
| 5,747,818 A | 5/1998 | Cecere |
| 5,766,379 A | 6/1998 | Lanford et al. |
| 5,798,529 A | 8/1998 | Wagner |
| 5,840,630 A | 11/1998 | Cecere et al. |
| 5,851,413 A | 12/1998 | Casella et al. |
| 5,899,740 A | 5/1999 | Kwon |
| 5,958,799 A | 9/1999 | Russell et al. |
| 5,959,358 A | 9/1999 | Lanford et al. |
| 6,031,299 A | 2/2000 | Stumfall et al. |
| 6,057,223 A | 5/2000 | Lanford et al. |
| 6,140,655 A | 10/2000 | Russell et al. |
| 6,322,672 B1 * | 11/2001 | Shuman et al. ........ 204/192.34 |

(Continued)

FOREIGN PATENT DOCUMENTS

| | | |
|---|---|---|
| JP | 4173988 | 11/1990 |
| JP | 2295117 | 12/1990 |

OTHER PUBLICATIONS

S. Herschbein et al., The Challenges of FIB Chip Repair & Debug Assistance in the 0.25 um Copper Interconnect Millenium, Proceedings from 24th International Symposium for Testing and Failure Analysis, Nov. 15-19, 1998, Dallas, Texas, pp. 127-130.

(Continued)

*Primary Examiner*—Shamim Ahmed
(74) *Attorney, Agent, or Firm*—Dorsey & Whitney LLP

(57) ABSTRACT

Apparatus and processes are disclosed for milling copper adjacent to organic low-k dielectric on a substrate by directing a charged-particle beam at a portion of the copper and exposing the copper to a precursor sufficient to enhance removal of the copper relative to removal of the dielectric, wherein the precursor contains an oxidizing agent, has a high sticking coefficient and a long residence time on the copper, contains atoms of at least one of carbon and silicon in amount sufficient to stop oxidation of the dielectric, and contains no atoms of chlorine, bromine or iodine. In one embodiment, the precursor comprises at least one of the group consisting of NitroEthanol, NitroEthane, NitroPropane, NitroMethane, compounds based on silazane such as HexaMethylCycloTriSilazane, and compounds based on siloxane such as Octa-Methyl-Cyclo-Tetra-Siloxane. Products of the processes are also disclosed.

49 Claims, 20 Drawing Sheets

U.S. PATENT DOCUMENTS

| | | | |
|---|---|---|---|
| 6,407,001 | B1 | 6/2002 | Scott |
| 6,509,276 | B1 | 1/2003 | Scott |
| 6,514,866 | B1 | 2/2003 | Russell et al. |
| 6,613,394 | B1* | 9/2003 | Kuckertz et al. ............ 427/488 |
| 6,641,705 | B1* | 11/2003 | Phaneuf et al. ........ 204/192.34 |
| 6,653,240 | B1* | 11/2003 | Crawford .................... 438/712 |
| 2001/0053605 | A1 | 12/2001 | Phaneuf et al. |
| 2002/0094694 | A1 | 7/2002 | Russell et al. |
| 2002/0195422 | A1 | 12/2002 | Sievers et al. |
| 2003/0038113 | A1 | 2/2003 | Makarov et al. |
| 2003/0060048 | A1 | 3/2003 | Russell et al. |
| 2004/0132287 | A1* | 7/2004 | Fischer et al. .............. 438/687 |

OTHER PUBLICATIONS

J. Phillips et al., Channeling effects during focused-ion-beam micromachining of copper, J. Vac. Sci. Technol. A 18(4), Jul./Aug. 2000, pp. 1061-1065.

H. Ximen et al., Halogen-Based Selective FIB Milling for IC Probe-Point Creation and Repair, Proceedings from 20th International Symposium for Testing and Failure Analysis, 1994, pp. 141-145.

H. Bender et al., Investigation on the Corrosion of Cu Metallization in the Focused Ion Beam System due to a low I2 Background, Proceedings from the 25th International Symposium for Testing and Failure Analysis; 1999, pp. 135-140.

V. Makarov et al, Practical FIB Chemistry for Etching Copper, Proceedings of 3RD AVS International Conference on Microelectronics and Interfaces, Feb. 11-14, 2002, Santa Clara, CA, USA, pp. 115-117.

V. Makarov et al., Dry Etching Considerations for Copper Metallizations, Proceedings of the 4th AVS International Conference on Microelectronics and Interfaces, Mar. 3-6, 2003 Santa Clara, California, USA, pp. 198-200.

H. Bender et al., Focused Ion Beam Analysis of Organic Low-k Dielectrics, Proceedings from the 26th International Symposium for Testing and Failure Analysis, Nov. 12-16, 2000, Bellevue, Washington, USA, pp. 397-405.

T. Stark et al., H2O enhanced focused ion beam micromachining, J. Vac. Sci. Technol. B 13(6), Nov./Dec. 1995, pp. 2656-2569.

P. Ho et al., Overview on Low Dielectric Constant Materials for IC Applications, in Low Dielectric Constant Materials for IC Applications, Ed. by P. Ho et al., Springer-Verlag, Berlin, Heidelberg 2003, Chapter I, pp. 1-21.

J. Gonzalez et al., Chemically enhanced focused ion beam micromachining of copper, J. Vac. Sci. Technol. B 19(6), Nov./Dec. 2001, pp. 2539-2542.

J. Gonzalez et al, Improvements in Focused Ion Beam Micro-machining of Interconnect Materials, J. Vac. Sci. Technol. B20(6), Nov./Dec. 2002, pp. 2700-2704.

L. Harriott, Digital scan model for focused ion beam induced gas etching, J. Vac. Sci. Technol. B 11(6), Nov./Dec. 1993, pp. 2012-2015.

R. Lee et al., Low Resisitivity FIB Depositions Within High Aspect Ratio Holes, Proceedings of the 22nd International Symposium for Testing and Failure Analysis, Nov. 8-22, 1996, Los Angeles, CA, pp. 85-88.

K. Edinger, Study of precursor gases for focused ion beam insulator deposition, J. Vac. Sci. Tehnol. B 16(6), Nov./Dec. 1998, pp. 3311-3314.

K. Edinger, Gas assisted etching of copper with focused ion beams, J. Vac. Sci. Technol. B 17(6), Nov./Dec. 1999, pp. 3058-3062.

V. Makarov et al., Copper Etch Milling Technique for Device Edits with the IDS P3X and IDS P3Xa, Application Note # rev.1.5, Jun. 19, 2001, pp. 1-5.

IDS P3X brochure, Schlumberger, printed Oct. 1999, two pages.

Y. Igarashi et al., Dry Etching Technique for Subquarter-Micron Copper Interconnects, J. Electronchem. Soc., vol. 142, No. 3, Mar. 1995, pp. L36-L37.

S. Pauthner, Device modification and gass assisted etching on Cu-samples, 3rd European FIB Users Group Meeting (EFUG99) Abstracts Oct. 4, 1999 (1 paragraph abstract of 8-page document).

2-Nitroethanol Material Safety Data Sheet, Aldrich Chemical Co., Inc., valid Feb. 2003-Apr. 2003, (four pages).

N. Goldblatt et al., Unique and Practical IC Timing Analysis Tool Utilizing Intrinsic Photon Emission, Microelectronics Reliability Conference, 2001, 41(9-10): 1507-1512.

D. Knebel et al., Diagnosis and Characterization of Timing-Related Defects by Time-Dependent Light Emission, IEEE International Test Conference, 1998, pp. 733-739.

T. Lundquist et al., Ultra-Thinning of C4 Integrated Circuits for Backside Analysis during First Silicon Debug, Microelectronics Reliability Conference, 2001, 41(9-10): 1545-1549.

T. Lundquist et al., Characterize Gate-Level Transistor Performance with PICA, Semiconductor International, 2001, 4 pages.

C. Musil et al., Focused Ion Beam Microsurgery for Electronics, IEEE Electron Device Letters, 1986, EDL-7(5):285-287.

* cited by examiner

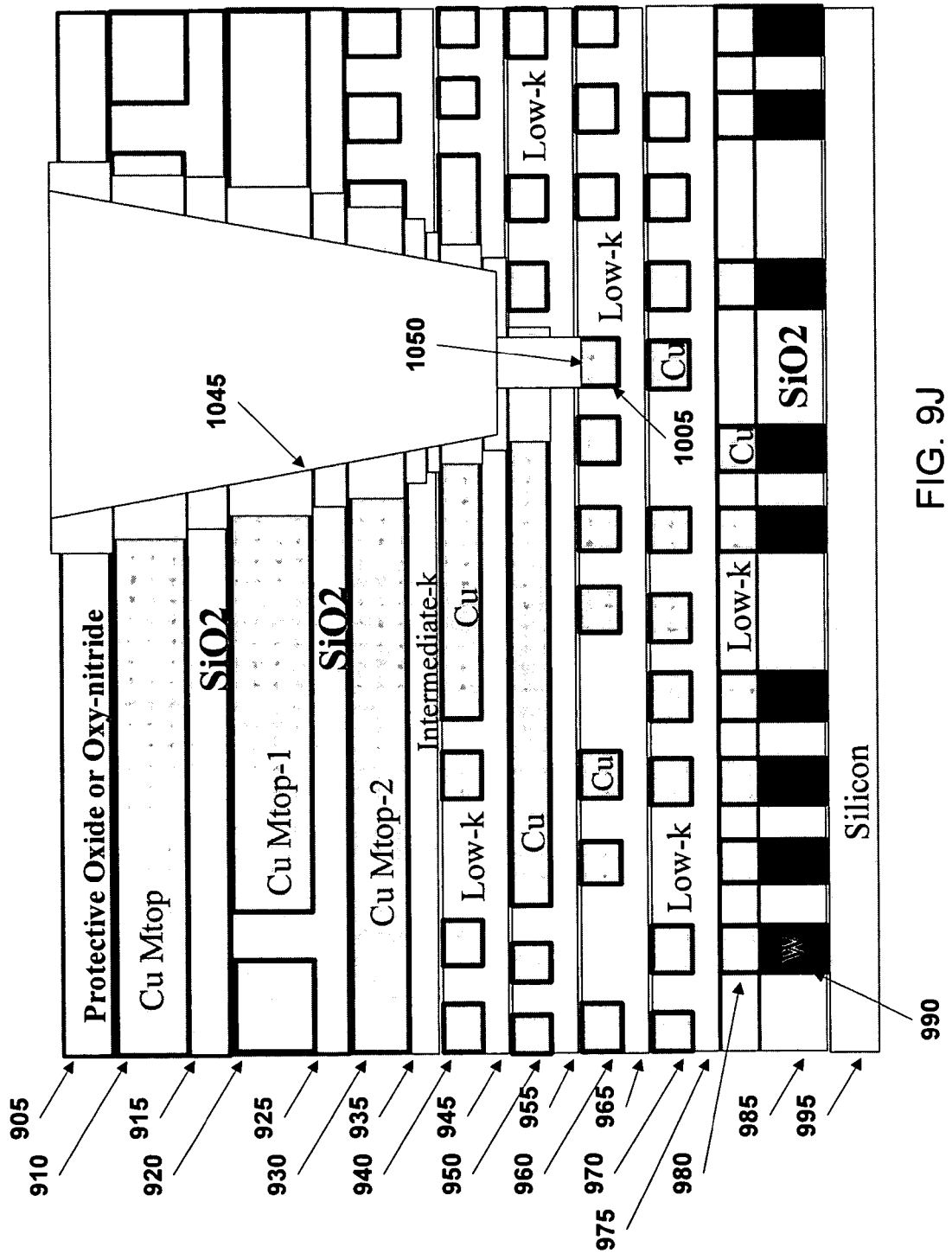

FIB MILLING OF COPPER OVER ORGANIC DIELECTRICS

BACKGROUND OF THE INVENTION

1. Field of the Invention

The invention relates to milling of copper with a focused ion beam, particularly to chemically-assisted milling of copper over organic dielectric materials.

2. Prior Art

The primary material used for internal wiring in advanced CMOS microchips is copper. For the debugging of these microchips with a focused-ion-beam (FIB) system, copper planes and traces should be cut uniformly and cleanly so as to electrically isolate across the separation created. Normally copper planes and traces in ICs consist of crystal grains each having a specific crystallographic orientation. Different orientations show significantly different etching rates under FIB operation. As a result, FIB etching of copper leads to a strong roughness formation on the etched copper surface which then propagates, upon perforation of the copper, to the underlying dielectric. See S. HERSCHBEIN et al., *The Challenges of FIB Chip Repair & Debug Assistance in the 0.25 um Copper Interconnect Millenium*, PROCEEDINGS FROM 24TH INTERNATIONAL SYMPOSIUM FOR TESTING AND FAILURE ANALYSIS, 15–19 Nov. 1998, Dallas, Tex., pp. 127–130.

The grain-dependent milling has been shown to be due to channeling of the $Ga^+$ in certain orientations; the more densely-packed (111) crystal plane results in energy deposition near the surface and thus increased sputtering over the more open planes. See J. PHILLIPS et al., *Channeling effects during focused-ion-beam micromachining of copper*, J. VAC. SCI. TECHNOL. A 18(4), July/August 2000, pp. 1061–1065.

The progression of the etching process, started on the copper surface, reaches the copper/dielectric interface not simultaneously as it would if the etching were uniform, but at different points, i.e., through the crystallites with the highest etch rates. This leads to significant damage to the underlying dielectric in exposed areas yet the residual copper must still be sputtered away. This is of particular concern when milling through power planes or bus lines to expose underlying metals for device editing because the underlying dielectric might be damaged. H. XIMEN et al., *Halogen-Based Selective FIB Milling for IC Probe-Point Creation and Repair*, PROCEEDINGS FROM 20TH INTERNATIONAL SYMPOSIUM FOR TESTING AND FAILURE ANALYSIS, 1994, pp. 141–145.

FIG. 1 shows an example of uneven copper etching due to variations in grain crystallographic orientation. The dimension of milled box 105 is 10 μm×10 μm.

For aluminum planes and traces, compounds containing reactive species of chlorine, bromine and iodine are used to address the problem of uneven FIB milling. But halogen-containing compounds are not suitable for FIB milling of copper metallizations. While such compounds are effective to enhance milling, they spontaneously etch copper and corrode exposed copper within hundreds of microns from the initial beam exposure point. See, for example, results with halogen-based compounds including iodine-based in S. HERSCHBEIN et al., *The Challenges of FIB Chip Repair & Debug Assistance in the 0.25 um Copper Interconnect Millenium*, PROCEEDINGS FROM THE 24TH INTERNATIONAL SYMPOSIUM FOR TESTING AND FAILURE ANALYSIS, 15–19 Nov. 1998, Dallas, Tex., pp. 127–130, and H. BENDER et al., *Investigation on Corrosion of Cu Metallization in the Focused Ion Beam System due to low $I_2$ Background*, PROCEEDINGS FROM THE 25TH INTERNATIONAL SYMPOSIUM FOR TESTING AND FAILURE ANALYSIS, 1999, pp. 135–140.

FIG. 2 shows an example of the adverse result of using iodine-based chemistry for assisted FIB milling of copper. A copper layer was milled in the circled region 205 using ethylene di-iodide enhanced metal etch chemistry as is typically used for etching of aluminum; see U.S. Pat. No. 5,840,630 of Cecere et al., *FIB Etching Enhanced with 1.2 Di-Iodo-Ethane*. Milling in region 205 was conducted with a 1.33 μm×0.5 μm milling box and a FIB current of 15 $pA/\mu m^2$. Bright areas are corroded copper. Corrosion growth occurs on exposure to air of the hygroscopic copper iodides resulting from the etching process. Arrow 210 shows the lateral extent over which copper is affected by the enhanced etch process, in this case more than 130 μm from the milling box as indicated at 215. Corrosion of copper conductors presents serous reliability issues such as high resistivity, electrical leakage and, ultimately, conductor failure.

There is thus a need for chemical precursors for assisting the FIB milling selectivity of copper which are non-corrosive but which minimize milling of underlying dielectric layers. Chemical precursors have been proposed for FIB milling of copper over conventional dielectric materials. See U.S. Pat. No. 6,514,866 B2 and U.S. Patent Publication No. 2003/0060048 A1 of Russell et al., *Chemically enhanced Focused Ion Beam Micro-Machining of Copper;* U.S. Patent Publication No. 2003/0038113 A1 of Makarov et al., *Process for charged particle beam micro-machining of copper;* V. MAKAROV et al, *Practical FIB Chemistry for Etching Copper*, PROCEEDINGS OF $3^{RD}$ AVS INTERNATIONAL CONFERENCE ON MICROELECTRONICS AND INTERFACES, Feb. 11–14, 2002, Santa Clara, Calif., USA, pp. 115–117; and V. MAKAROV et al., *Dry Etching Considerations for Copper Metallizations*, PROCEEDINGS OF THE $4^{TH}$ AVS INTERNATIONAL CONFERENCE ON MICROELECTRONICS AND INTERFACES, Mar. 3–6, 2003 Santa Clara, Calif., USA, pp 198–200.

New dielectric materials, such as organic low-k dielectrics will play an increasingly significant role in advanced microelectronics. The variety of these materials increases each day. Many of these materials, especially organic ones, are extremely fragile under ion beam bombardment. See H. Bender et al., *Focused Ion Beam Analysis of Organic Low-k Dielectrics*, PROCEEDINGS FROM THE 26TH INTERNATIONAL SYMPOSIUM FOR TESTING AND FAILURE ANALYSIS, 12–16 Nov. 2000, Bellevue, Wash., USA, pp. 397–405.

The current state of the art is insufficient for the challenge of copper over organic dielectric. This is primarily because the art is directed to FIB milling of copper over dielectric materials which have traditionally been used in microelectronics, such as $SiO_2$, $Si_3N_4$ and their relatives, like Fluorinated Silicon Glass (FSG). Some proposals for copper etching employ oxygen and/or oxygen containing compounds as precursors for etching of copper over these dielectrics. See U.S. Pat. No. 6,407,001 B1 of Scott, *Focused Ion Beam Etching of Copper;* U.S. Pat. No. 6,509,276 B2 of Scott, *Focused Ion Beam Etching of Copper with Variable Pixel Spacing*.

Oxygen, water, hydrogen peroxide, ammonia carbonate, and some other precursors and their mixtures have proven successful at copper etch over traditional dielectrics. Actually the etching rate of Cu is slightly reduced by oxygen-containing precursors but that of the traditional dielectric is reduced more and thus selectivity and therefore milling uniformity at the copper dielectric interface is improved.

The effect of using oxygen-containing compounds for etching copper over organic dielectric materials is completely opposite to that for etching of copper over $SiO_2$ dielectrics. Precursors which are favorable for milling of copper over $SiO_2$ are detrimental for milling of copper over organic dielectric materials. One of these materials, water, is one of the best precursors for enhancing rather than retarding the milling of organic materials. See U.S. Pat. No. 6,407,001 B1 of Scott, *Focused Ion Beam Etching of Copper;* U.S. Pat. No. 6,509,276 B2 of Scott, *Focused Ion Beam Etching of Copper with Variable Pixel Spacing;* U.S. Pat. No. 5,798,529 of Wagner, *Focused Ion Beam Metrology;* T. STARK et al., $H_2O$ *enhanced focused ion beam micromachining,* J. VAC. SCI. TECHNOL. B 13(6), November/December 1995, pp. 2656–2569; U.S. Pat. No. 5,958,799 of Russell et al., *Method for Water Vapor Enhanced Charged-Paricle-Beam Machining;* and H. Bender et al., *Focused Ion Beam Analysis of Organic Low-k Dielectrics,* PROCEEDINGS FROM THE 26TH INTERNATIONAL SYMPOSIUM FOR TESTING AND FAILURE ANALYSIS, 12–16 Nov. 2000, Bellevue, Wash., USA, pp. 397–405.

Most proposed low-k dielectrics as well as all those presently used with k<3 are organic materials where carbon is one of the main elements carrying the dielectric structure. See P. Ho et al., *Overview on Low Dielectric Constant Materials for IC Applications,* in LOW DIELECTRIC CONSTANT MATERIALS FOR IC APPLICATIONS, Ed. by P. Ho et al., Springer-Verlag, Berlin, Heidelberg 2003, Chapter I, pp. 1–21.

Another approach to FIB milling of copper over $SiO_2$, $Si_3N_4$ and their relatives is described in U.S. Patent Publication 2001/0053605 A1 to M. PHANEUF et al., *Apparatus and Method for Reducing Differential Sputter Rate.* A precursor gas, tungsten hexacarbonyl, is said to dynamically produce a sacrificial layer which is intended to eliminate non-uniform milling of the surface of the material to be removed. The layer interacts with the ion-beam material-removal process to increase the uniformity of removal and is removed with the material. See also U.S. Patent Publication 2002/0195422 A1 of Sievers et al., *Focused Ion Beam Process for Removal of Copper.*

The application of metal-containing precursors to provide a scattering layer was investigated and found to be beneficial in improving etch uniformity. See J. GONZALEZ et al., *Chemically enhanced focused ion beam micromachining of copper,* J. VAC. SCI. TECHNOL. B 19(6), November/December 2001, pp. 2539–2542. However, this approach provides no electrical isolation benefit and, even though it enhances uniformity of milling, the application of this to FIB circuit editing is clumsy at best. For example, using a tungsten deposition may achieve this sacrificial layer but removing this layer would cause the rapid degradation of organic dielectric, for reasons noted by H. Bender et al., *Focused Ion Beam Analysis of Organic Low-k Dielectrics,* PROCEEDINGS FROM THE 26TH INTERNATIONAL SYMPOSIUM FOR TESTING AND FAILURE ANALYSIS, 12–16 Nov. 2000, Bellevue, Wash., USA, pp. 397–405.

Methods have been proposed to improve uniformity of copper removal based on differentiation of ion dose delivery to grains with different orientation. See U.S. Pat. No. 6,509,276 B2 to Scott, *Focused Ion Beam Etching of Copper with Variable Pixel Spacing,* and U.S. Patent Publication No: US 2001/0053605 A1 of M. Phaneuf et al, *Apparatus and Method for Reducing Differential Sputter Rates.* However efficient this may be for overcoming roughness formation on copper surface, it remains clumsy and at best is only a partial solution when organic low-k is involved. Normally the ion dose delivery rate (ion current density) is defined from relative contrast of copper grains as they are seen in some secondary particles (electrons, ions, etc.) under ion bombardment. On the other hand, copper etching with an ion beam is accompanied with permanent copper grain modification (etching,. recrystallization, etc.) that therefore requires adequate redefining of the ion current density. But ion beam bombardment significantly changes relative contrast between grains and therefore confuses so the current density requires redefining. The need to minimize etching of organic dielectric is not addressed.

Three ways are known to decrease the variation in etching rates between different copper grains: (1) copper surface oxidation, (2) ion-beam bombardment of a copper surface under various (at least two) angles of incidence, and (3) ion-beam bombardment of the copper surface at lower beam energy as has been reported by J. GONZALEZ ET AL, *Improvements in Focused Ion Beam Micro-machining of Interconnect Materials,* J. VAC. SCI. TECHNOL. B20(6), November/December 2002, pp. 2700–2704.

For copper surface oxidation, see J. GONZALEZ et al., *Improvements in Focused Ion Beam Micro-machining of Interconnect Materials,* J. VAC. SCI. TECHNOL. B20(6), November/December 2002, pp. 2700–2704. Amorphous layer blocks open directions in copper grains, randomizes ion beam and reduces channeling. For ion beam bombardment of a copper surface under various angles of incidence see V. Makarov et al, Dry Etching Considerations for Copper Metallizations, *Proceedings of $4^{th}$ AVS International Conference on Microelectronics and Interfaces,* Mar. 3–6, 2003 Santa Clara, Calif., USA, pp. 198–200. In this case grain orientation becomes insignificant because there is no single direction of bombardment, and etching of the different grains occurs with one average rate.

It is known from our experience as well as the report of H. Bender et al., *Focused Ion Beam Analysis of Organic Low-k Dielectrics,* PROCEEDINGS FROM THE 26TH INTERNATIONAL SYMPOSIUM FOR TESTING AND FAILURE ANALYSIS, 12–16 Nov. 2000, Bellevue, Wash., USA, pp. 397–405 that beam assisted reactions between organic low-k dielectric material and oxygen-containing precursor molecules lead to deterioration of the dielectric structure. In fact ion bombardment with no precursor results in the dielectric becoming conductive—carbonized.

No single step definitive solution has been proven which really solves the problems mentioned, so work continues for an answer that will address these issues. FIB milling of copper overlying fragile, organic dielectric materials must be made more uniform, and special measures to protect the underlying dielectric must be taken. A solution is needed which would decrease the development of roughness on FIB milled copper surfaces and provide more uniform copper etching while protecting organic dielectric from damage.

SUMMARY OF THE INVENTION

Apparatus and processes are disclosed for milling copper adjacent to organic low-k dielectric on a substrate by directing a charged-particle beam at a portion of the copper and exposing the copper to a precursor sufficient to enhance removal of the copper relative to removal of the dielectric, wherein the precursor contains an oxidizing agent, has a high sticking coefficient and a long residence time on the copper, contains atoms of at least one of carbon and silicon in amount sufficient to stop oxidation of the dielectric, and contains no atoms of chlorine, bromine or iodine. In one embodiment, the precursor comprises at least one of the group consisting of NitroEthanol, NitroEthane, NitroPropane, NitroMethane, compounds based on silazane such as HexaMethylCycloTriSilazane, and compounds based on siloxane such as Octa-Methyl-Cyclo-Tetra-Siloxane. Products of the processes are also disclosed.

These and other features consistent with the invention will become apparent to those of skill in the art from the illustrations and description which follow.

BRIEF DESCRIPTION OF THE DRAWING

FIGS. 9A–9L schematically illustrate a practical application in accordance with embodiments of the invention.

DETAILED DESCRIPTION

Embodiments of the invention provide for FIB milling (also called etching or micromachining) of copper metallization over organic dielectric material in a microcircuit structure carried on a substrate. Methods in accordance with embodiments of the invention can be carried out using a FIB system having capability for introduction of a gaseous precursor at the surface of the structure to be milled.

Apparatus for properly delivering the precursor comprises a computer-controlled FIB instrument such as described in U.S. Pat. No. 5,140,164 to Talbot et al., the content of which is incorporated herein by this reference. Suitable charged-particle-beam systems include, but are not limited to, the IDS OptiFIB, the IDS P3X and IDS P3Xa instruments commercially available from NPTest, Inc. of San Jose, Calif.

The apparatus includes a reservoir to hold the precursor. The reservoir is temperature controlled (heated and/or cooled as required for the properties of the precursor) so as to deliver the precursor via diffusion through a delivery system comprising tubing, valves, fittings, etc all under temperature control connecting the reservoir to a precursor injector. The reservoir is valved, preferably via computer control, so that it is open only when needed. The temperature of the reservoir is set so as to produce the desired precursor flux onto the sample device as described in U.S. Pat. No. 5,747,818 to Cecere, *Thermoelectric Cooling in Gas-Assisted FIB System*. The injector is positioned relative to the device for optimal performance. Precursor flux can be estimated from the pumping rate of the chamber pumps, the chamber pressure, the chamber base pressure and the inner diameter of the chemistry injector. Generally the injector diameter is large compared to the distance between the injector and the sample device so that the decrease in flux with distance is negligible. Pumping is important as volatiles are created by the etching process and these must be removed so as not to affect other FIB system components such as the secondary-particle detector used for imaging and navigation as well as the FIB source column which need to remain under high vacuum for proper operation. As a balance is maintained between ion flux and precursor flux, the ion current that is to be used defines the required precursor flux and vice versa. The pumping rate of the apparatus is determined by the precursor flux to be used. If the ion current is low then the precursor flux is low. So as to adequately monitor the relative pressure change, the base pressure (or local base pressure in cases where there is a monitored sub-volume of the chamber) must be significantly lower than the contribution of the precursor.

Figure 1:
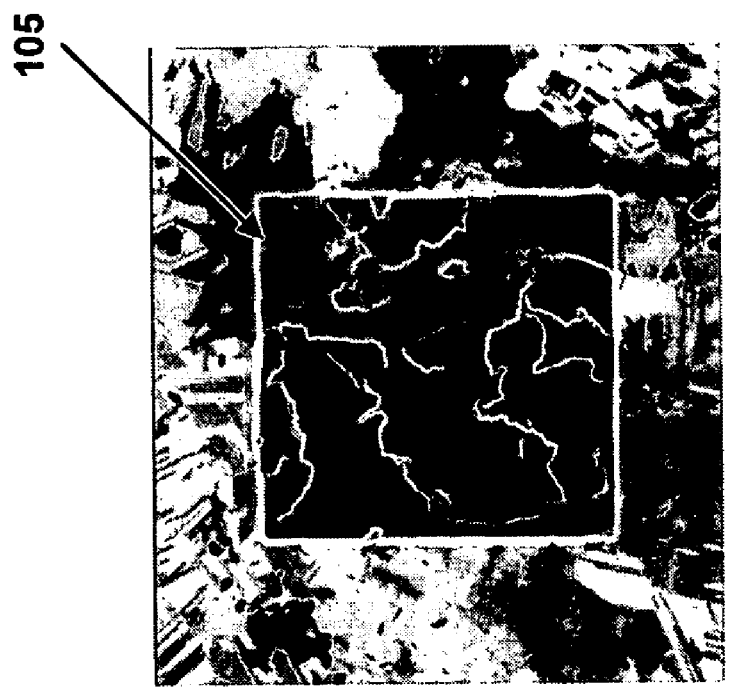
FIG. 1 shows a prior-art example of uneven copper etching due to variations in grain crystallographic orientation.
Figure 2:
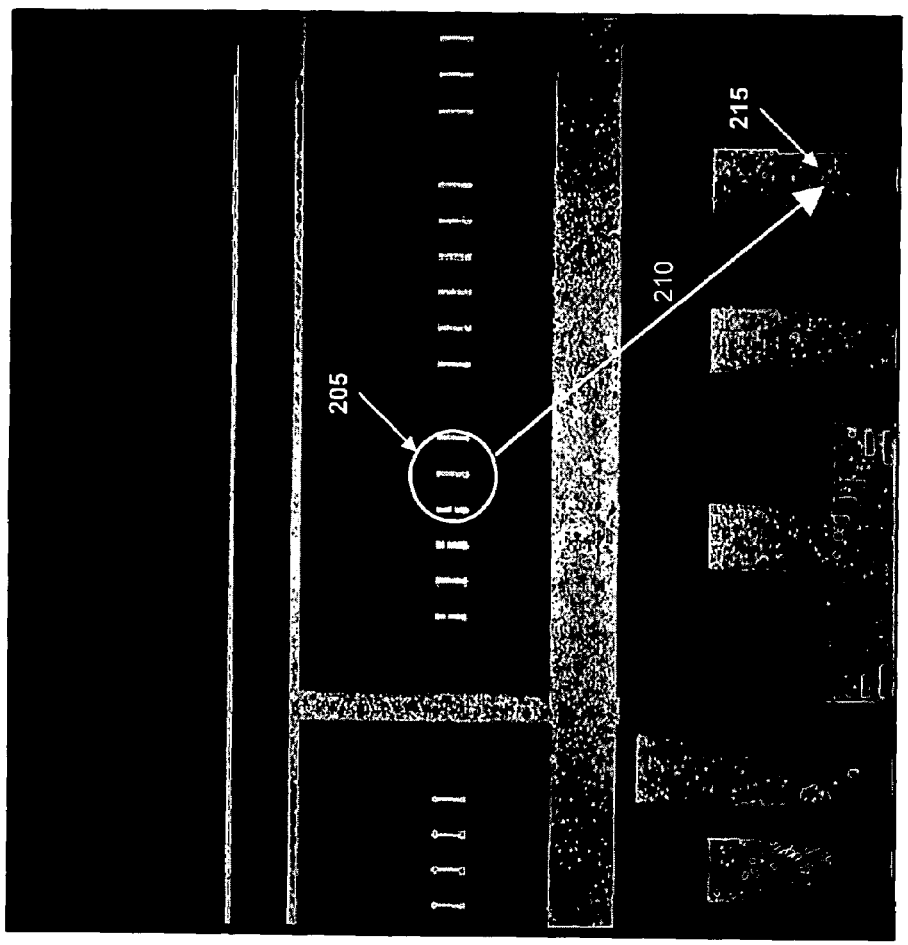
FIG. 2 shows prior-art example of the adverse result of using iodine-based chemistry for assisted FIB milling of copper.
Figure 3:
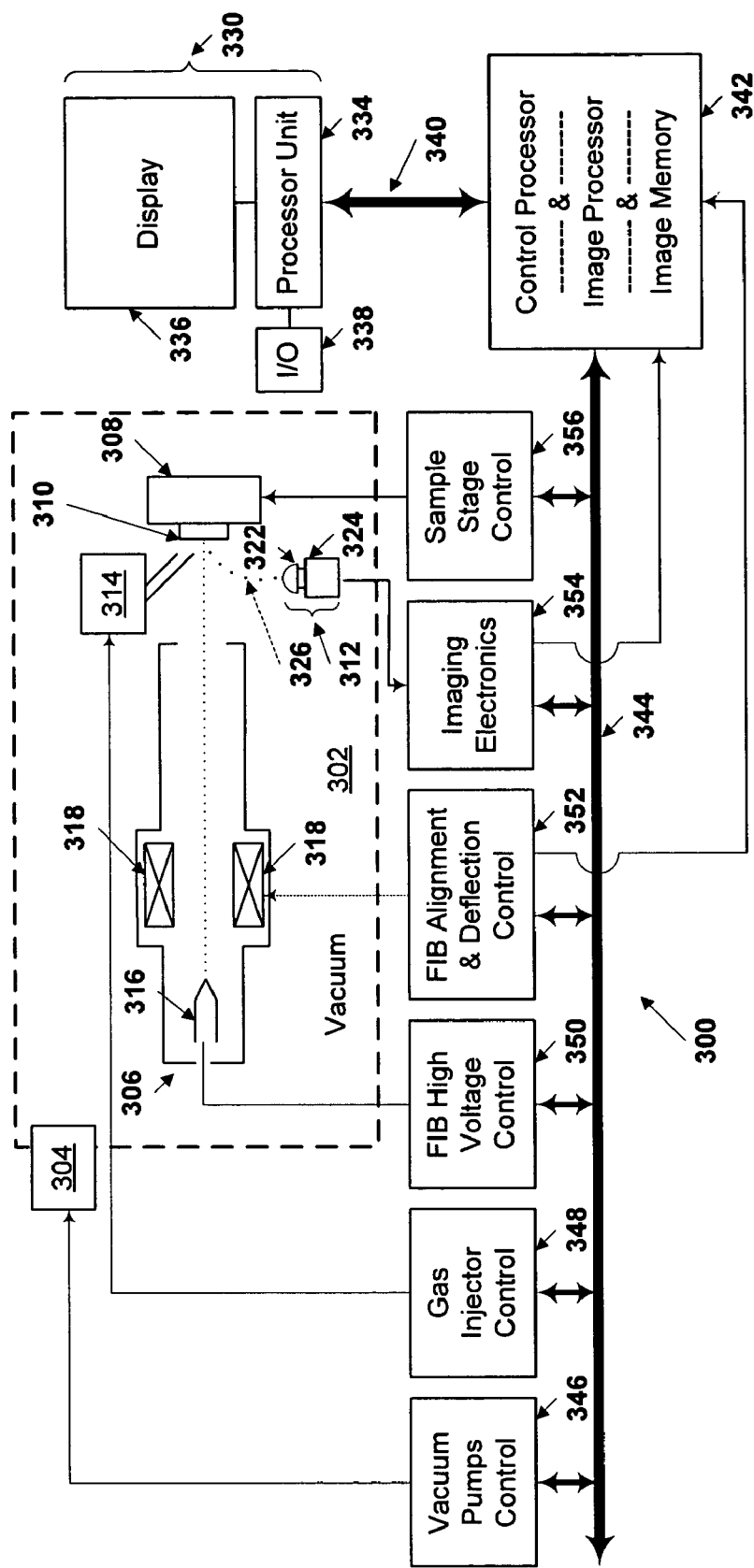
FIG. 3 schematically illustrates a charged-particle-beam system equipped for carrying out processes in accordance with the invention.

FIG. 3 schematically illustrates such a FIB instrument. A vacuum chamber 302 evacuated by pumps 304 encloses a charged-particle beam source FIB column 306, a stage for controlling the relative movement of ion focusing optics and specimen, a fixture 308 for holding a specimen 310 such as an IC device to be repaired, a detector 312, and a precursor source gas injector 314 containing one or more precursors for carrying out processes in accordance with the invention. Column 306 includes an ion source 316, and ion-optical elements 318 for controlling alignment and deflection of an ion beam 320. Detector 312 may comprise a scintillator 322 and a photo-multiplier tube 324 or some other detector such as an electron multiplier for detecting secondary electrons 326 emitted when ion beam 320 impinges on specimen 310.

The system includes a workstation 330 having a processor unit 332, a monitor 334 and input/output (I/O) devices 338 such as a keyboard and/or mouse. Workstation 330 is linked by a bus 340 to a system control unit 342 comprising a control CPU, an image processor and image memory. System control unit 342 communicates via a bus 344 with a vacuum-pumps control 346 for controlling vacuum pumps 304, with gas injector control 348 for controlling gas injector 314, with FIB high-voltage control 350 for controlling ion source 316, with FIB alignment & deflection control 352 for controlling ion optical elements 318, with imaging electronics 354 which receive a detector signal from detector 312, and with specimen-stage control 356 for controlling a stage 308 to position column relative to the specimen 310 or vice versa. System control unit 342 preferably receives image information from imaging electronics 354 and, after image processing such as described below, supplies beam control information to FIB alignment and deflection control 352.

In operation, a specimen 310 having copper adjacent to organic dielectric on a substrate is placed in vacuum chamber 302. (As used herein, the term "organic dielectric" includes any dielectric which contains carbon.) Chamber 302 is evacuated. Under control of system control unit 342, FIB 320 is scanned over a selected region of the copper to mill away material by sputtering while gas injector 314 supplies a precursor so as to expose the copper to an amount of the precursor sufficient to enhance milling.

Our conclusion is that precursors can be highly specific for the dielectric material to be protected. Changes in the dielectric materials used to build integrated circuits (ICs) may require selection of corresponding precursors.

In accordance with embodiments of the present invention, precursors are employed which simultaneously serve more than one purpose: (1) copper surface oxidation, (2) randomizing the ion-beam angles of incidence on the copper surface, (3) retarding deterioration of organic dielectric material adjacent the copper.

While not wishing to be bound by theory, it is believed that the role of oxidizing the copper is to disturb the copper periodicity—its longer range order. The surface of the open grains—those which exhibit channeling—is reordered which reduces channeling. The oxidation of the surface rearranges the surface copper atoms so that the open structure is no longer present on the top monolayers. The copper spacing on the oxidized copper is different than that of the open crystal spacings. By having a reorganized surface which is constantly renewed, the incident ions see the crystal channels blocked and in collision with the copper atoms the incident energy is randomized so that the ions are scattered out of the channeling directions. At the same time the oxidation power of the precursor must be such that the organic dielectric is not oxidized. This is achieved by the proper balance of carbon-like and oxidizer elements within the precursor so that the oxidizer consumes carbon-like precursor atoms instead of those in the organic dielectric. (With prior-art use of water as a precursor, we believe that oxygen contained in the water precursor oxidizes carbon, forming volatile molecules CO and/or $CO_2$ and thereby pulling carbon from the dielectric material and destroying its structure. In our view, this is a principal reason why prior-art oxygen-containing precursors such as water are in general so destructive to organic dielectrics.)

Such multi-purpose precursors have some or all of the following properties:

1. Contain oxygen, nitrogen or some other oxidizing agent to oxidize the copper surface and prevent channeling. However, to avoid post-milling corrosion of copper, the precursor should not contain Cl, Br or I. Compounds containing F, although not corroding copper, are preferably avoided in the presence of organic low-k dielectric containing silicon as F spontaneously attacks organic low-k dielectric containing silicon.

2. Have a high sticking coefficient and a moderate to long residence time on the surface. This then creates on the copper surface an instantaneous layer of several monolayers, enough for incident ions to be scattered at a sufficient angle before they actually impact the crystalline copper surface. The sufficient angle here refers to an angle greater than the theoretical critical angle for channeling. A high sticking coefficient is preferably greater than 0.01, optimally greater than 0.1. Residence time is a measure of how long the chemical will remain on the surface once adsorbed. Residence time is defined quantitatively as an average time which an adsorbed precursor molecule spends on the surface until it is desorbed. Residence time is indicated here as short, moderate, or long, defined respectively as less than 100 nsec, from 100 nsec to 10 μsec, and longer than 10 μsec. Residence time should be sufficiently long that coverage of the surface with precursor molecules will provide enough precursor material for efficient FIB operation under reasonable refresh and dwell times of the ion beam. That is, a precursor with insufficient residence time on the surface to be milled will be dissipated in the vacuum environment of the FIB system more quickly than the scanned beam can make use of it. Refresh time & dwell time are the main time characteristics of an ion-beam scanning system. The refresh time is the time that takes for the beam to revisit same spot in the scanning box. The dwell time is how long the beam stays in the spot. For discussion of sticking coefficient g and residence time $\tau_E$ see L. HARRIOTT, *Digital scan model for focused ion beam induced gas etching*, J. VAC. SCI. TECHNOL. B 11(6), November/December 1993, pp. 2012–2015.

3. To prevent deterioration of exposed organic dielectric by the mechanism of carbon volatilization, the precursor molecules should contain enough carbon or silicon to inhibit any attack on the dielectric by the oxygen or the other oxidizing agent contained in the precursor gas or gas mixture. The concentration of C and Si relative to oxygen is important, as too much oxygen will quickly destroy low-k dielectric. The amount of oxygen atoms in the precursor gas or gas mixture should be no more than about twice the sum of amounts of carbon atoms and silicon atoms: $[O] \leq 2([Si]+[C])$. For example, a molecule of nitro-ethanol ($OHC_2H_4NO_2$) contains 4 oxidizing atoms (N+3O) and 2 carbon-like atoms 2C) and thus meets this criterion. As the precursor molecules are bombarded with ions, fragmentation results; carbon or silicon separated from the precursor molecules protects carbon in the dielectric structure from combining with oxygen. To the extent that the dielectric is damaged, the precursor effectively serves to locally replace the organic dielectric with deposited insulating dielectric (such as $SiO_2$ created from fragments of a Silicon-containing precursor). It is desirable to avoid excessive amounts of C in the precursor, as has been reported by J. GONZALEZ et al, *Improvements in Focused Ion Beam Micro-machining of Interconnect Materials*, J. VAC. SCI. TECHNOL. B20(6), November/December 2002, pp. 2700–2704. An "excessive" amount of C in the precursor occurs when the amount of carbon like atoms exceeds more than about 4 times the amount of oxidizing atoms in the precursor. An example for this limit is the molecule butanol ($C_4H_9OH$).

Not wishing to be bound by theory, some guidelines for selection of a precursor are as follows. An ideal precursor should uniformly etch Cu and protect underlying dielectric. Cu does not have non-corroding, simple volatile compounds which survive ion bombardment (such as $AlI_3$, $AlBr_3$ and $AlCl_3$ for aluminum). Milling uniformity, therefore, is believed to be achieved through both oxidation and atomic mixing of copper atoms with precursor components so as to suppress channeling in Cu grains and yield nonconductive sputtered products. Oxygen-containing and/or nitrogen containing compounds seem to be the best precursors for this role. However, O may readily destroy organic dielectrics since it volatilizes the carbon into $CO_2$ and/or CO, essential to organic dielectrics including carbon-doped oxides (CDO). To avoid oxidation and volatilization of the carbon in an organic dielectric, the precursor should contain carbon and/or carbon-like atoms (chemically close to carbon, belonging to the same column group of elements in the Periodic Table, like Silicon and Germanium). The amount of these atoms in the precursor molecule should be equal to or slightly larger than the amount which is necessary to create stoichiometric carbon (carbon-like) oxides using oxygen contained in the same molecule. In this case the reaction of oxidation of carbon belonging to the dielectric will be significantly suppressed which will protect the dielectric from deterioration. On the other hand, one should avoid an excessive amount of carbon-like elements in precursor molecule. These carbon-like elements exhibit significant electrical conductivity and, therefore, non-oxidized excessive carbon-like material may be redeposited over the place of copper cut during the milling operation and reconnect electrically those parts which should be disconnected. An empirical relation between oxygen (or another oxidizing element) and carbon or carbon-like atoms in precursor molecule is given by the following inequality:

$$[C+Si]/4 \leq [O] \leq 2[C+Si]$$

Embodiments in accordance with the invention employ precursors which help uniform Cu etching yet reduce etching rates of known organic dielectrics.

The optimal edit recipe depends on the organic material. For instance, the optimal chemistry to ion flux ratio must be reduced as carbon contents increases since the more the contents of carbon in dielectric, the more it needs to be protected from ion beam mixing and carbonization. Further, to produce a lower-k dielectric material the density of the material is decreased (such as by increasing porosity); for milling in the presence of decreased-density dielectric material, the ion flux ratio must also be reduced. Decreasing the ion current allows the precursor chemistry to form new dielectric without impairing the integrity of the underlying dielectric.

Figure 4:
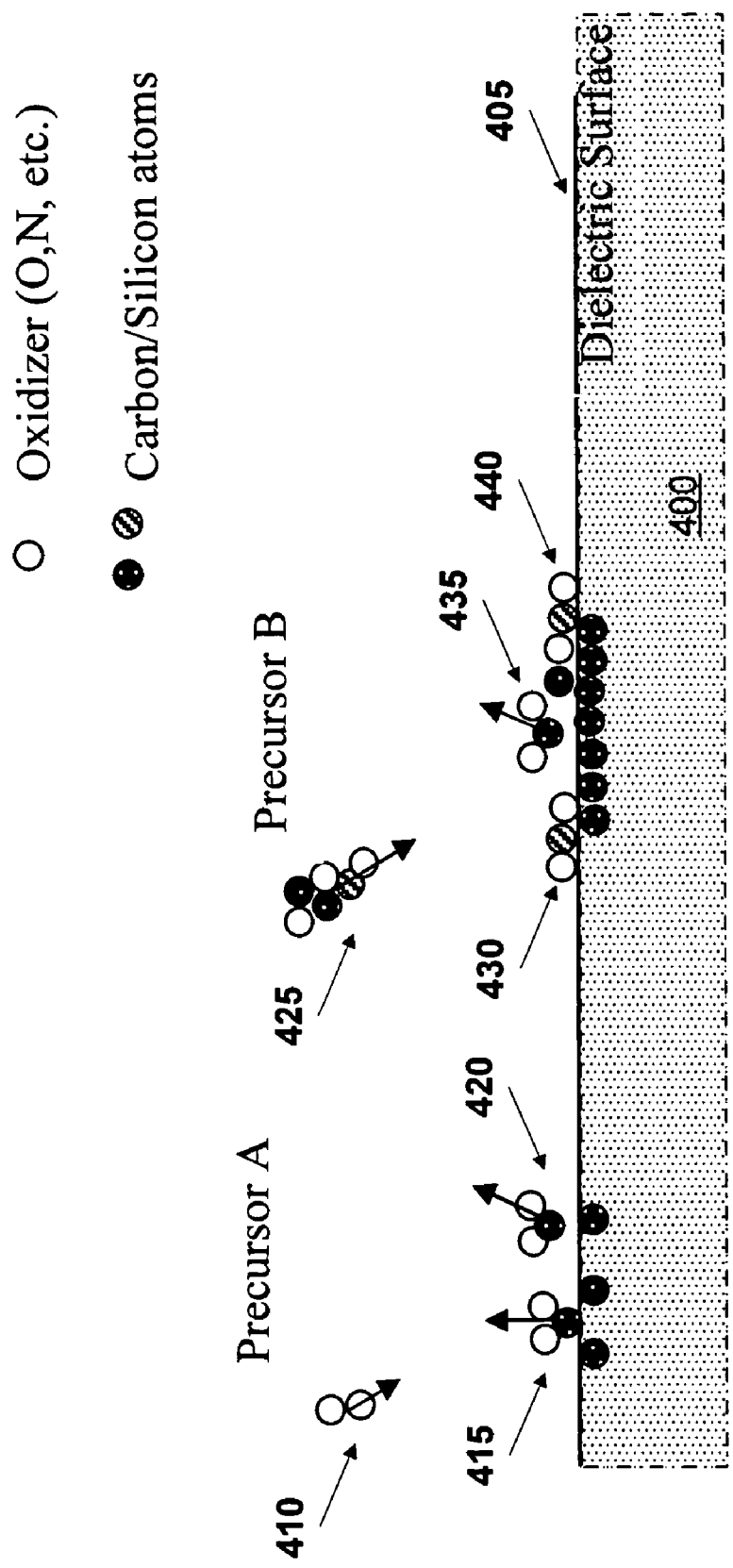
FIG. 4 schematically illustrates the effect of two different precursors on the structure of a low-k organic dielectric under ion bombardment at the dielectric surface.

FIG. 4 schematically illustrates the effect of two different precursors on the structure of a low-k organic dielectric 400 under ion bombardment at the dielectric surface 405. Molecule 410 of precursor A contains atoms of an oxidizing agent such as oxygen and/or nitrogen which readily oxidize carbon atoms of the dielectric structure at indicated at 415 and 420. Precursor A meets condition 1. above, but does not meet condition 3. Molecule 425 of precursor B contains atoms of an oxidizing agent such as oxygen and/or nitrogen, but also contains atoms of silicon and/or carbon. The oxidizing agent in Precursor B is hindered from combining with carbon atoms of the dielectric structure due to the presence in Precursor B of a sufficient amount of carbon and/or silicon atoms. Precursor B meets condition 1 above and also meets condition 3. In case of precursor B, the stoichiometry of the precursor on the dielectric surface protects carbon in dielectric from oxidation.

The ion-beam current chosen for a given operation regulates the quantity of the precursor available for a given precursor partial pressure. The higher the current, the less the quantity of precursor that can be accumulated on the surface, so that with increasing current the influence of the precursor on the etching process is decreased. Decreasing the current allows the instantaneous precursor quantity to accumulate. If the current is too low, etching stops and deposition occurs instead. Proper etching process is normally provided under precursor pressure in the working chamber between $10^{-6}$ and $10^{-4}$ Torr and with an average ion current density between 0.01 pA/um$^2$ and 500 pA/um$^2$ over the area scanned by the beam. The relation between ion-beam current and gas flux should be optimized to provide smooth and controllable etching. This optimal regime can be determined empirically.

Vapor pressure (VP) of the precursor is such as to enable its delivery by diffusion to the operational area of the FIB as well as easy handling in condensed form. The vapor pressure range of usability is from about 0.01 Torr to about 1000 Torr. As vapor pressure is strongly temperature dependent, the range of vapor pressure should be considered over a temperature range of 0–100 degrees Celcius and even a more preferred range of 10–65 degrees Celsius for easy delivery and handling. It is desirable to employ precursor compounds which are solid or liquid at the temperature of the copper to be milled (typically room temperature) and which are sufficiently volatile at temperatures noticeably higher than the temperature of the copper to be milled so that, upon reaching a surface of the copper, the precursor will more readily concentrate to create an instantaneous film on the copper. To avoid problems during an operation arising from excessive concentration of the precursor in areas of the FIB chamber other than the beam operation areas, it is desirable to use insulating compounds.

The FIB is sensitive to a too high chamber pressure (in the operation chamber of the FIB the pressure needs to be less than about $10^{-4}$ Torr) and yet it must be sufficient to enable the process to be carried out in a reasonable time. The FIB sensitivity to high chamber pressure is most likely due to the opening between the operation chamber and the FIB column which is needed to obtain the desired field of view of the FIB tool. Therefore the desired operating pressure in the chamber is generally chosen to be less than about $5 \times 10^{-5}$ Torr. In general, the partial pressure of the precursor will fall within the range from about $10^{-6}$ Torr to about $10^{-4}$ Torr. A good rule of thumb is for the base pressure of the chamber to be a factor of 5 and preferably a factor of 10 below the operating pressure.

For higher copper-etching efficiency, the precursor may be supplied continuously or intermittently (pulsed) and/or the ion-beam flux may be directed at the sample continously or intermittently (blanked). Referring again to FIG. 3, blanking of ion flux is controlled, for example, by FIB High Voltage Control 350 of FIB system 500 under control of system control unit 342; blanking of precursor gas flux is controlled, for example, by gas injector control 348 under control of system control unit 342. The regularity of the flux interruption is best elaborated experimentally. What is involved here is the deposition of a non-conducting material. A primary goal of the process, in addition to etching of copper, is to avoid damage to the delicate low-k dielectric.

Candidate precursors may include compounds normally used for deposition, but under FIB-system operating conditions where milling occurs instead. As the goal is to obtain clean, electrically-isolating cuts of the copper, metal-containing compounds are undesirable unless their conductivity is suppressed by oxidizing agents or other agents from the precursor gas or gas mixture. Compounds normally used for insulator deposition are in general more desirable.

While a precursor which is conductive and/or which produces electrical conductivity when fragmented by the ion beam may be used to produce uniform etching, the requirement for electrical isolation as is the case in a IC would be defeated by deposition of the precursor and/or its conductive fragments and negate the benefit of uniform etching. For example, while Tungsten Carbonyl W(CO)$_6$ has characteristics which are attractive for copper etching, it is not the most appropropriate precursor due to the risk of deposition of conductive tungsten. Thus, it is desirable that the precursor be an insulator precursor (not a conductor precursor) and that its fragmentation by the ion beam result in one or more volatiles, such as CO and/or CO$_2$, and/or one or more insulators, such as SiO$_2$, rather than in conductors. It is desirable that fragmentation of the precursor produces no electrical conductivity (nothing which is electrically conductive). As used herein, the term "volatile" comprises compounds existing mainly in a gaseous form at the working temperature of the FIB instrument, typically at room temperature. As used herein, the term "room temperature" means at or about standard temperature (at or about 20 degrees Celcius).

The following Table compares the characteristics of a selection of precursor candidates investigated, including those characteristics desired for a precursor to be used in milling copper adjacent organic low-k dielectric.

Compounds shown in the Table which have been found suitable for protecting organic low-k dielectric when used to assist the milling of copper are noted in bold type. These are Nitro-Ethanol $OHC_2H_4NO_2$; Nitro-Ethane $C_2H_5NO_2$; Nitro-Propane $C_3H_7NO_2$; Nitro-Methane $CH_3NO_2$; Hexa-Methyl Cyclo-Tri-Silazane $(CH_3)_6(SiHN)_3$; and Octa-Methyl-Cyclo-Tetra-Siloxane $(CH_3)_8(SiO)_4$. The list of suitable compounds is not exhaustive; other precursor compounds having characteristics as discussed herein suitable for protecting organic low-k dielectric when used to assist copper milling are also considered to be within the scope of the invention, including but not limited to other compounds based on silazane and compounds based on siloxane including cyclo-siloxanes.

Table of Characteristics Important for Etching Copper over & around Organic Dielectrics Part 1

| Precursor Chemical | Water $H_2O$ | $XeF_2$ | Tungsten Carbonyl $W(CO)_6$ | $O_2$ | Ammonia Carbonate $(NH_4)_2CO_3$ | Ammonium Hydroxide $NH_4OH$ | OctaMethyl-Cyclo-TetraSiloxane $(CH_3)_8(SiO)_4$ |
|---|---|---|---|---|---|---|---|
| $\dfrac{VP(Torr)}{Temperature(C.)}$ | OK | OK | OK | OK | OK | OK | OK |
| Residence time | Moderate | Long | Long | Short | Moderate | Moderate | Long |
| $\dfrac{([C]+[Si])}{[O]}$ | 0 | 0 | 1 | 0 | 1/3 | 0 | 1 |
| Insulating Products | Good | Good | No | OK Good | OK Good | GOOD | Good |
| Molecular Weight | 18 | 169 | 352 | 32 | 96 | 34 | 296 |
| MSDS class | Good | Fair | Good | Good | Good | Good | Good |
| Contains NO Cl, Br or I | Yes | Yes | Yes | Yes | Yes | Yes | Yes |
| Environmentally Safe | Yes | Fair | Yes | Yes | Yes | Yes | Yes |
| Results | Poor | Poor | Poor | Poor | Poor | Poor | Good |

Table of Characteristics Important for Etching Copper over & around Organic Dielectrics Part 2

| Precursor Chemical | Nitro-Ethanol $OHC_2H_4NO_2$ | Nitro-Ethane $C_2H_5NO_2$ | Nitro-Propane $C_3H_7NO_2$ | Nitro-Methane $CH_3NO_2$ | Hexa-Methyl Cyclo-Tri-Silazane $(CH_3)_6(SiHN)_3$ |
|---|---|---|---|---|---|
| $\dfrac{VP(Torr)}{Temperature(C.)}$ | OK | OK | OK | OK | OK |
| Residence time | Long | Long | Long | Long | Long |
| $\dfrac{([C]+[Si])}{[O]}$ | 2/3 | 1 | 3/2 | 1/2 | Large |
| Insulating Products | GOOD | GOOD | GOOD | GOOD | GOOD |
| Molecular Weight | 88 | 75 | 89 | 61 | 219 |
| MSDS class | Good | Good | Good | Hazard | Good |
| Contains NO Cl, Br or I | Yes | Yes | Yes | Yes | Yes |
| Environmentally Safe | Yes | Yes | Yes | Yes | Yes |
| Results | Good | Good | Good | Good | Good |

Table of Characteristics Important for Etching Copper over & around Organic Dielectrics Part 3

| Precursor Chemical | Methanol $CH_3(OH)$ | Ethanol $C_2H_5(OH)$ | 1-Propanol $C_3H_7(OH)$ | 1-Butanol $C_4H_9(OH)$ | 1-Pentanol $C_5H_{11}(OH)$ | 1-Hexanol $C_6H_{13}(OH)$ |
|---|---|---|---|---|---|---|
| $\dfrac{VP(Torr)}{Temperature(C.)}$ | High | High | High | OK | OK | OK |
| Residence time | Short | Short | Moderate | Moderate | Moderate | Moderate |
| $\dfrac{([C]+[Si])}{[O]}$ | 1 | 2 | 3 | 4 | 5 | 6 |
| Insulating Products | GOOD | GOOD | GOOD | POOR C build-up | POOR C build-up | POOR C build-up |

-continued

| Molecular Weight | 32 | 46 | 60 | 74 | 88 | 102 |
|---|---|---|---|---|---|---|
| MSDS class | Good | Good | Good | Good | Good | Good |
| Contains NO Cl, Br or I | Yes | Yes | Yes | Yes | Yes | Yes |
| Environmentally safe | Yes | Yes | Yes | Yes | Yes | Yes |
| Results | Poor | Poor | GOOD | Poor | Poor | Poor |

In one recipe of interest, Nitroethanol is used as the precursor with ion-beam-current density in the range between 1 pA/$\mu m^2$ and 8 pA/$\mu m^2$, particularly, 4 pA/$\mu m^2$. To expose the copper by removing dielectric, the precursor gas pressure is significantly reduced or no precursor gas is used at all so that dielectric is removed with ion sputtering only. Once exposed, milling of the copper is enhanced by the precursor.

EXAMPLES

Figure 5:
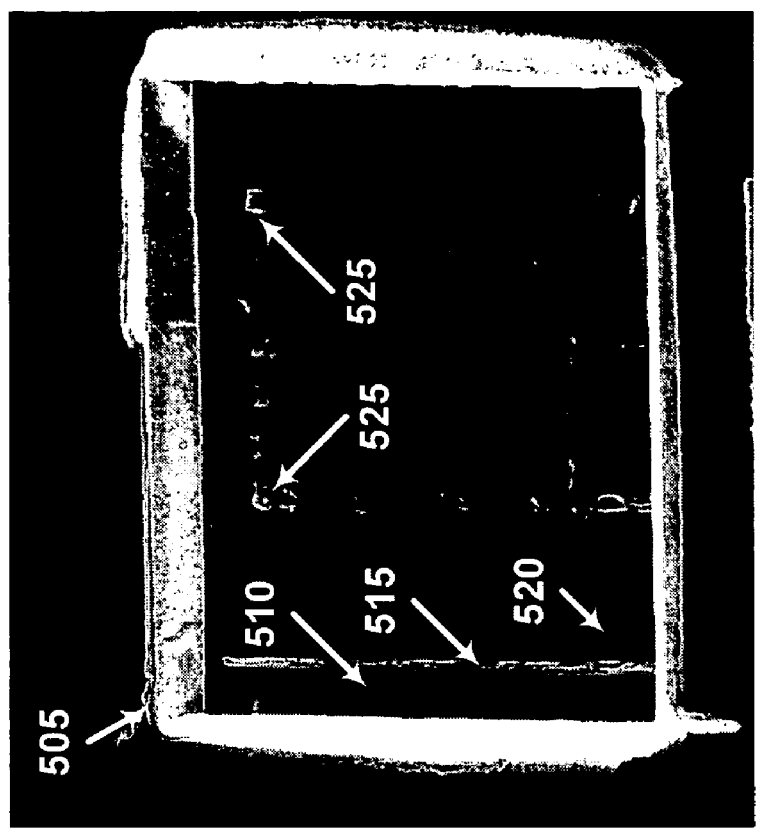
FIG. 5 is a micrograph of an unsuccessful attempt to mill copper using prior-art $NH_4OH$ as a precursor to enhance milling.

FIG. 5 is a micrograph of an unsuccessful attempt to mill copper using prior-art NH$_4$OH as a precursor to enhance milling. Top metal layer 505 was embedded in SiO$_2$ dielectric 510 and was successfully milled using the NH$_4$OH precursor. An attempt to use the same regime for milling of a further copper layer 515 over organic dielectric 520 (Black Diamond™, Applied Materials Inc.) was unsuccessful as it led to unwanted exposure of a deeper metal layer 525.

Figure 6:
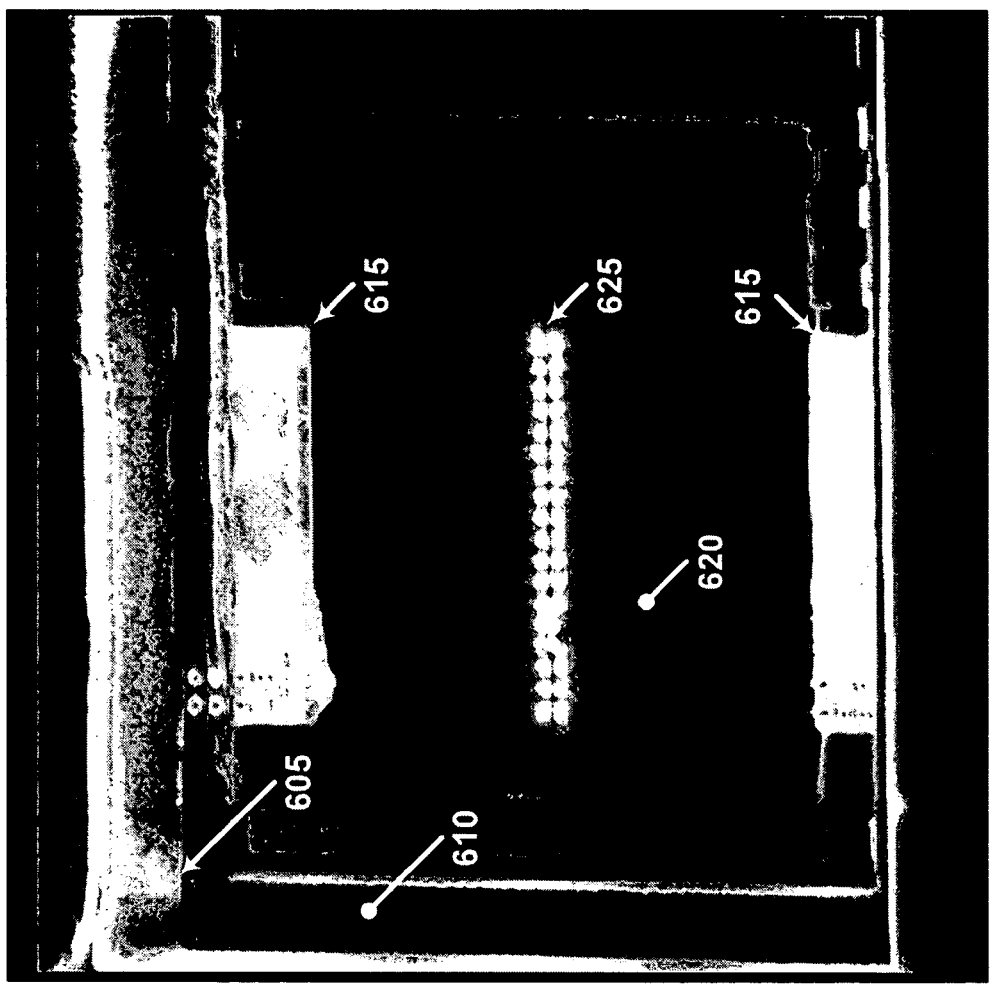
FIG. 6 is a micrograph showing the structure of FIG. 5 in which copper was successfully milled using Nitroethanol as precursor in accordance with an embodiment of the invention.

FIG. 6 is a micrograph showing the same structure as in FIG. 5, but in which copper was successfully milled using Nitroethanol as precursor in accordance with an embodiment of the invention. In this example, pressure in the chamber was 1–2×10$^{-5}$ Torr and the ion-beam-current density was 4 pA/$\mu m^2$. As in the structure of FIG. 5, top metal layer 605 was embedded in SiO$_2$ dielectric 610 and was successfully milled using a prior-arat process. Further copper layer 615 over organic dielectric 620 (Black Diamond™, Applied Materials Inc.) is cleanly cut. Note the flat bottom of the dielectric region 620 exposed by milling. Two rows of metal contacts 625 in the center are vias connected to the next layer.

Figure 7:
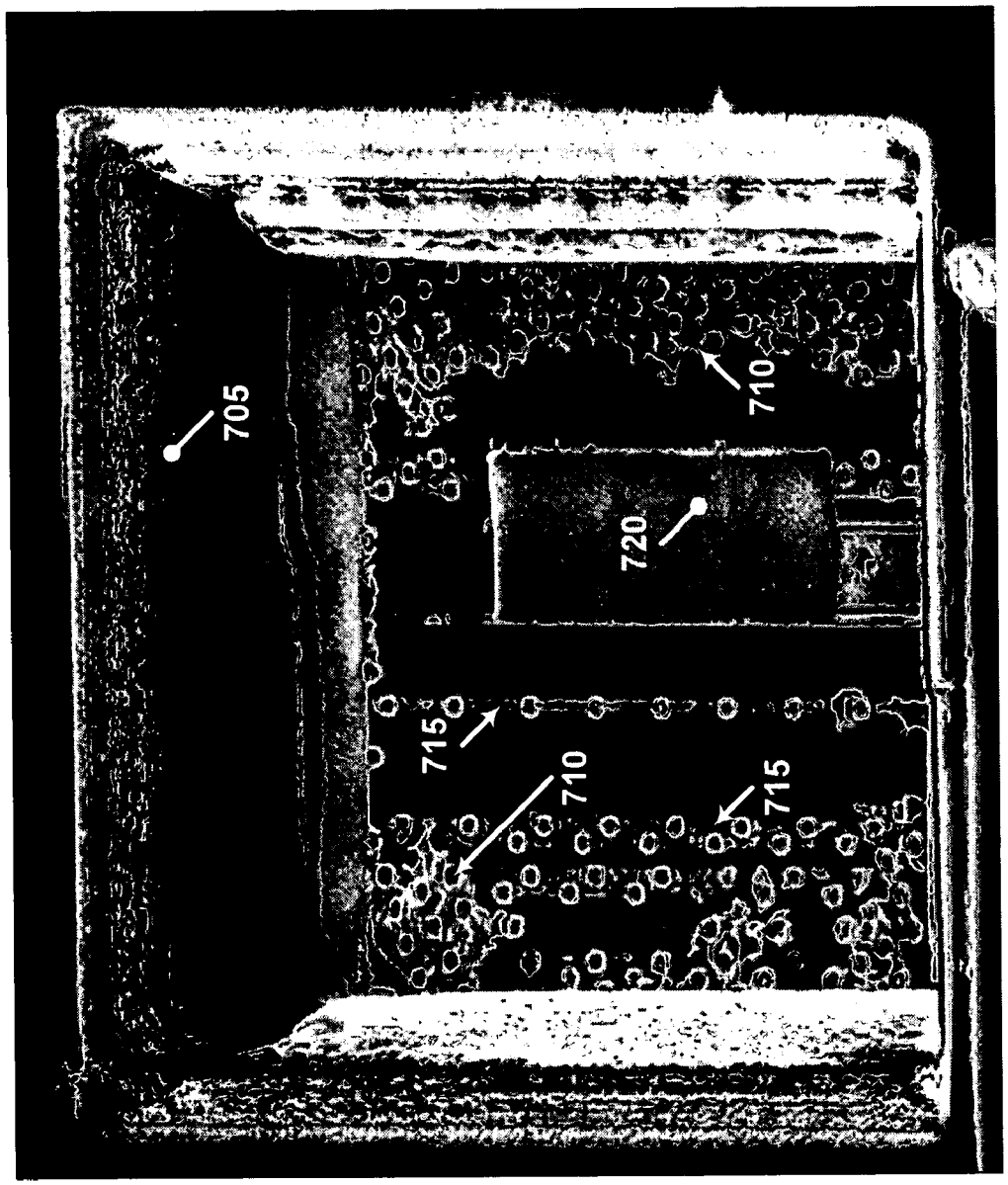
FIG. 7 is a micrograph of a further-unsuccessful attempt to mill copper using prior-art $NH_4OH$ as a precursor to enhance milling.

FIG. 7 is a micrograph of a further unsuccessful attempt to mill copper using prior-art NH$_4$OH as a precursor to enhance milling. Two top layers of this structure were embedded into SiO2 dielectric and were succesfully cut using NH$_4$OH precursor.

Thereafter the two top layers were isolated with insulator deposition 705 and are therefore not visible in FIG. 7. A copper layer 710 over Coral™ Novellus Inc, dielectric was then exposed using the NH$_4$OH precursor. An attempt to etch layer 710 using the NH$_4$OH precursor was unsuccessful as it led to revealing metal lines 715 of the next layer before milling of layer 710 was completed. A rectangular patch 720 was deposited in an attempt to repair the earliest overmilling of the Coral™ Novellus, Inc dielectric.

Figure 8:
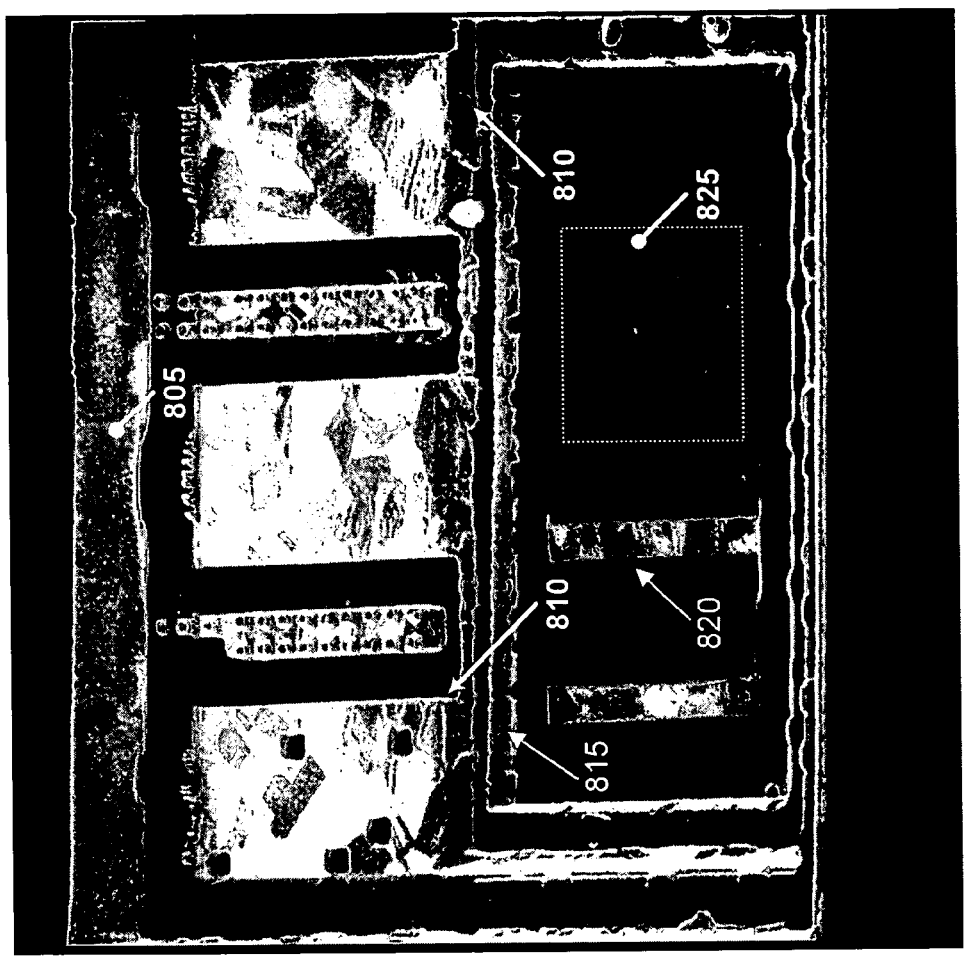
FIG. 8 is a micrograph showing the equivalent structure as in FIG. 7 in which prior-art $NH_4OH$ precursor was used to enhance milling of the two top layers of the structure; but Octa-Methyl-Cyclo-Tetra-Siloxane was used to cut open the copper over the Coral™ (Novellus, Inc) dielectric.

FIG. 8 is a micrograph showing the same structure as in FIG. 7. In this example, the prior-art NH$_4$OH precursor was successfully used to enhance milling of the two top layers of the structure. Thereafter the two top layers were isolated with insulator deposition. Two deeper copper layers 815, 820 embedded in Coral™ Novellus, Inc organic. dielectric were then cut by milling with Octa-Methyl-Cyclo-Tetra-Siloxane precursor to expose a deeper dummy metal layer 825 shown in rectangle. In this example, chamber pressure was 1–3×10$^{-5}$ Torr and ion-beam current density was 1–3 pA/$\mu m^2$.

FIGS. 9A–9L schematically illustrate a practical application of apparatus and processing in accordance with embodiments of the invention. FIGS. 9A–9L illustrate milling through multiple layers to expose a copper conductor in the interconnect region of a microchip structure having multiple dielectric types, including organic low-k dielectric, and depositing material to connect to the exposed conducotr and create a contact pad.

Figure 9A:
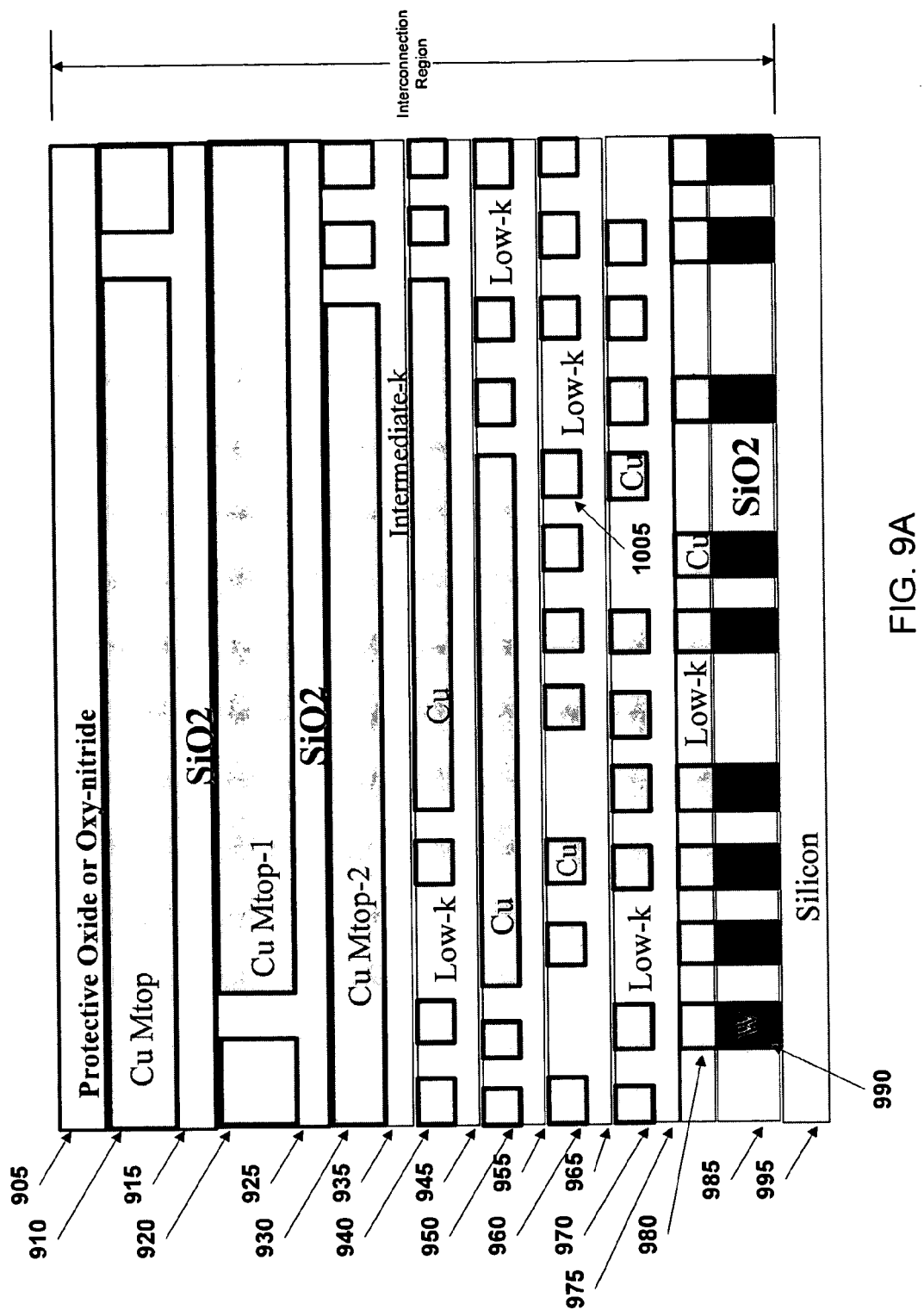

FIG. 9A is a simplified model of a portion of a microchip in which all the conductive wire traces are perpendicular to the plane of the image. The wide traces are power planes or power buses. These power plane traces often contain dielectric typical of what lies below it; because of mechanical considerations the fabrication process generally leaves this dielectric in the power planes at certain process defined intervals. Vias, the vertical interconnections between the horizontal metallizations, are not shown in this model except for the contacts between the copper and the silicon which are typically made of tungsten (W). Further, the poly-silicon or other materials making the gate connection in the lowest SiO2 region are not shown.

At the top is a protective layer 905 of oxide or oxy-nitride. Next is a top metal layer 910 Mtop of copper, embedded in SiO$_2$ dielectric and overlying a layer 915 of SiO$_2$ dielectric. Next is a metal layer 920 Mtop-1 of copper, embedded in SiO$_2$ dielectric and overlying a layer 925 of SiO$_2$ dielectric. Next is a metal layer 930 Mtop-2 of copper, embedded in SiO$_2$ dielectric and overlying a layer 935 of intermediate-k dielectric. The intermediate-k dielectric may be, for example, a material such as FSG or even SiO$_2$. Next is a metal layer 940 of copper, embedded in organic dielectric and overlying a layer 945 of organic dielectric. Next is a metal layer 950 of copper, embedded in organic dielectric and overlying a layer 955 of organic dielectric. Next is a metal layer 960 of copper, embedded in organic dielectric and overlying a layer 965 of organic dielectric. Next is a metal layer 970 of copper, embedded in organic dielectric and overlying a layer 975 of organic dielectric. Next is a metal layer 980 of copper embedded in organic dielectric 985. Next is a layer of tungsten 990 embedded in SiO$_2$ dielectric and overlying silicon substrate 995.

For circuit editing, the goal is to contact or cut a certain trace in the interconnect region of the device, such as a copper trace 1005 of layer 960. Traces closer to the silicon, such as trace 1005, are especially hard to access. As wide power planes block access, they can often be partially removed or opened and thus be used to provide access to the buried trace.

Figure 9B:
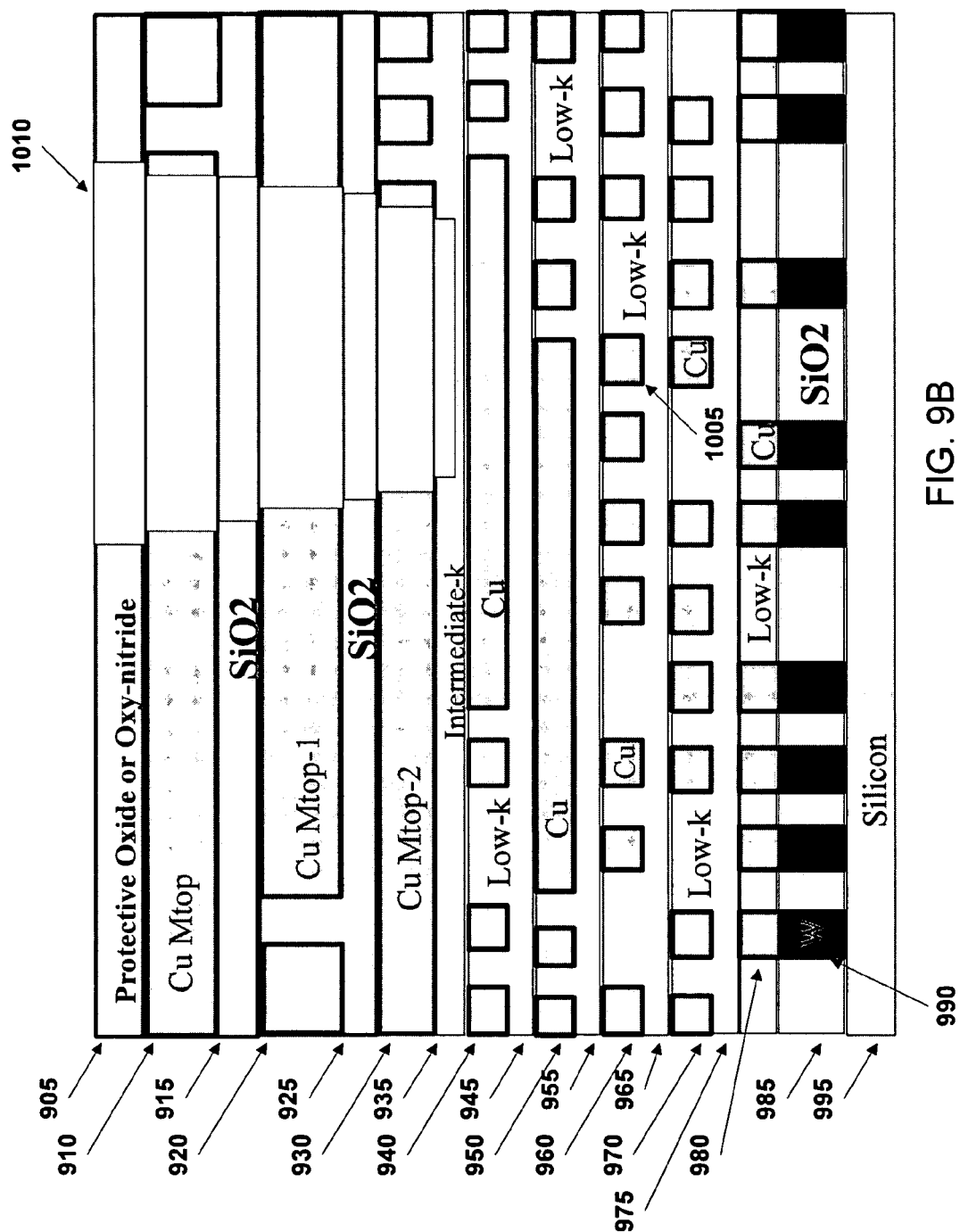

FIG. 9B shows the first stage of milling, in which openings 1010 to the intermediate-k dielectric layer 935 are milled using a processes suitable for milling of copper adjacent SiO$_2$ dielectric, for example as described in U.S. Patent Application Publication 2003/0038113 A1 of Makarov et al., which is incorporated herein by this reference. The inverted pyramid structure of openings 1010 accomplishes two things: 1) the aspect ratio is kept large to facilitate collection of imaging information and for endpoint determination; and 2) any copper which is deposited on the walls and is not made non-conductive by the precursor is hindered from electrically shorting vertically power planes and/or traces.

Degradation of the organic dielectric becomes apparent if it is exposed to the standard $SiO_2$ or FSG milling precursor—$XeF_2$. Silicon-containing organic dielectric is spontaneously etched by $XeF_2$. As the dielectric can be contained within the power planes, for example between copper traces of layer 940, continuing to mill with the standard FIB-milling precursor would not only remove the dielectric within copper layer 940 but also the underlying dielectric layer 945. Thus, the precursor gas flow should be stopped before perforating the intermediate dielectric layer 935.

Figure 9C:
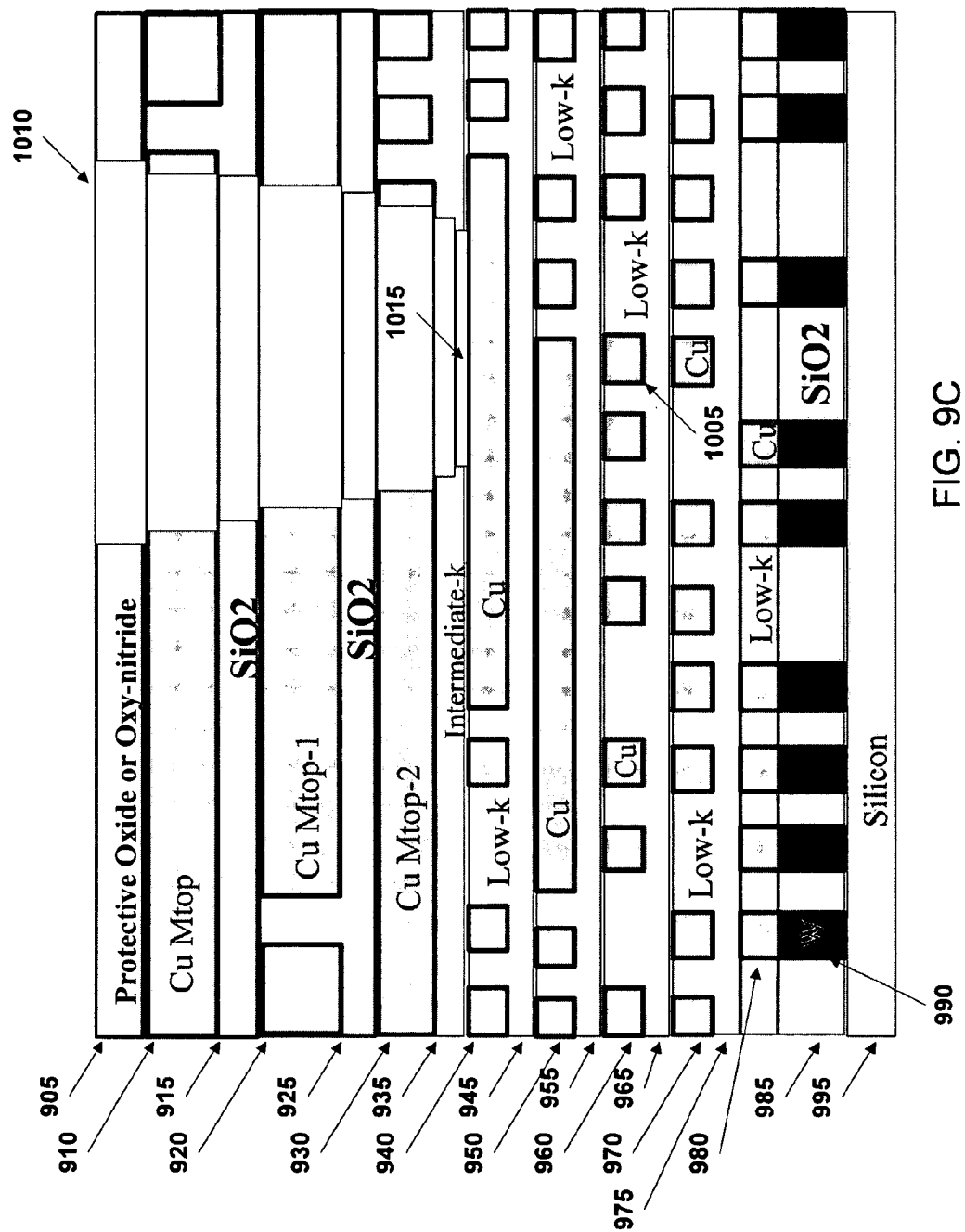

FIG. 9C shows the result of continued FIB milling, without precursor, of intermediate dielectric layer 935 to expose copper layer 940 at 1015. When copper layer 940 is exposed, milling continues using a process in accordance with the invention employing a precursor which enhances removal of copper but which hinders removal of organic dielectric.

Figure 9D:
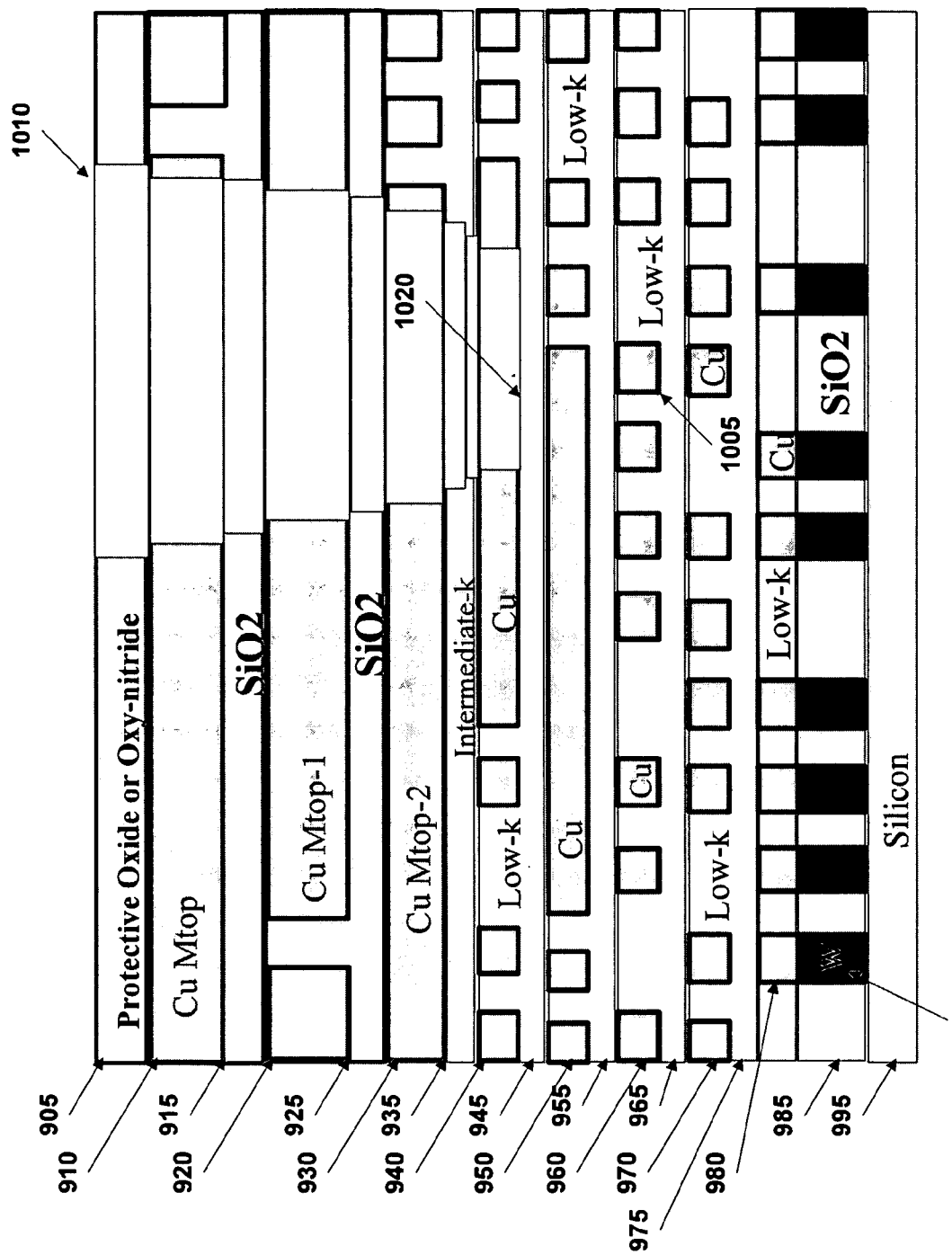

FIG. 9D shows the copper of layer 940 removed at 1020 to expose organic dielectric layer 945.

Figure 9E:
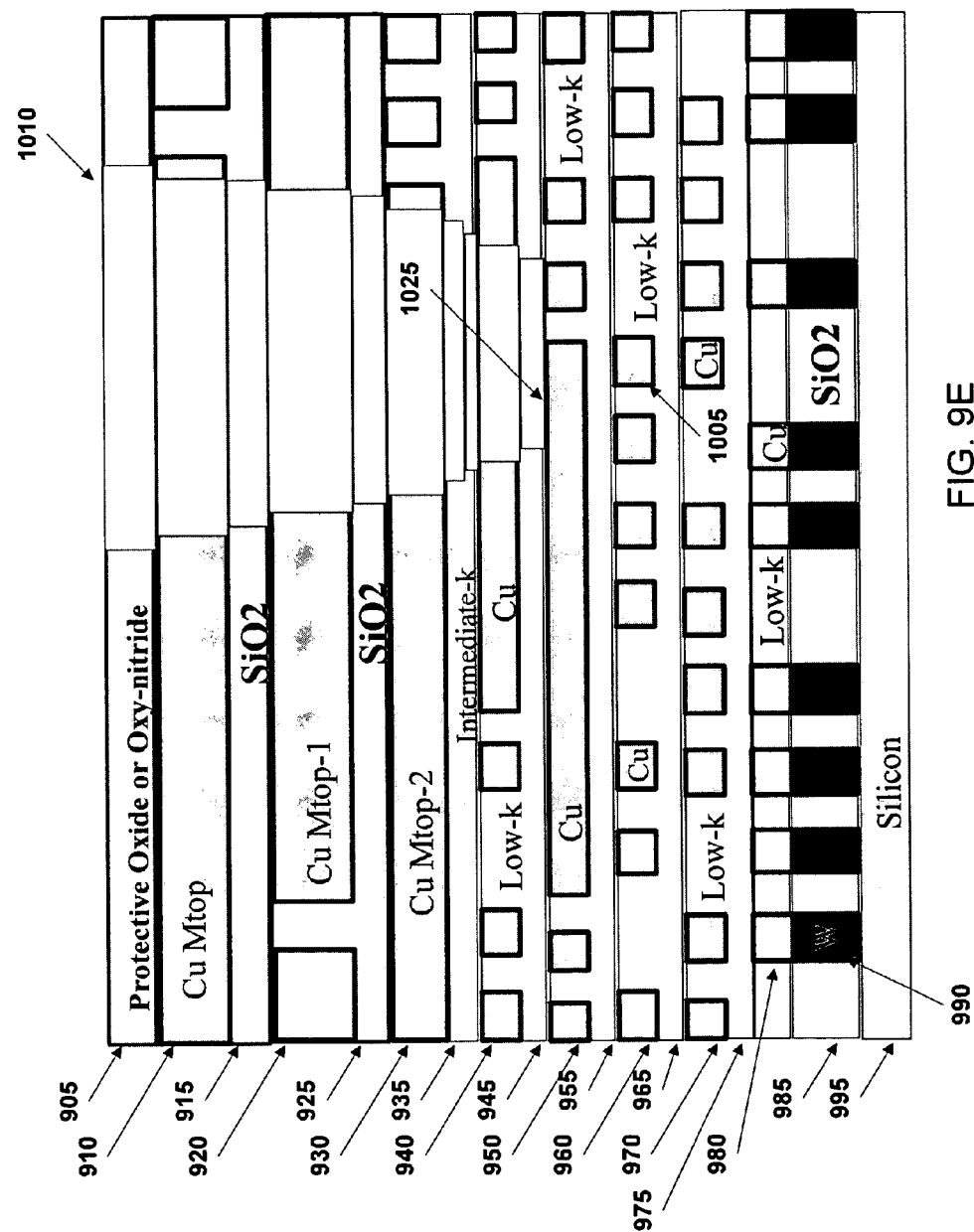

FIG. 9E shows the organic dielectric of layer 945 removed at 1025 to expose copper layer 950. Various precursors may be used to remove or open the organic dielectric, though $XeF_2$ is not recommended for the CVD (chemical vapor deposition) type organic dielectrics which generally contain silicon and will therefore etch uncontrollably with $XeF_2$. $NH_4OH$ and other precursors have been found suitable for removal of organic dielectric.

Milling continues using a process in accordance with the invention employing a precursor which enhances removal of copper but which hinders removal of organic dielectric.

Figure 9F:
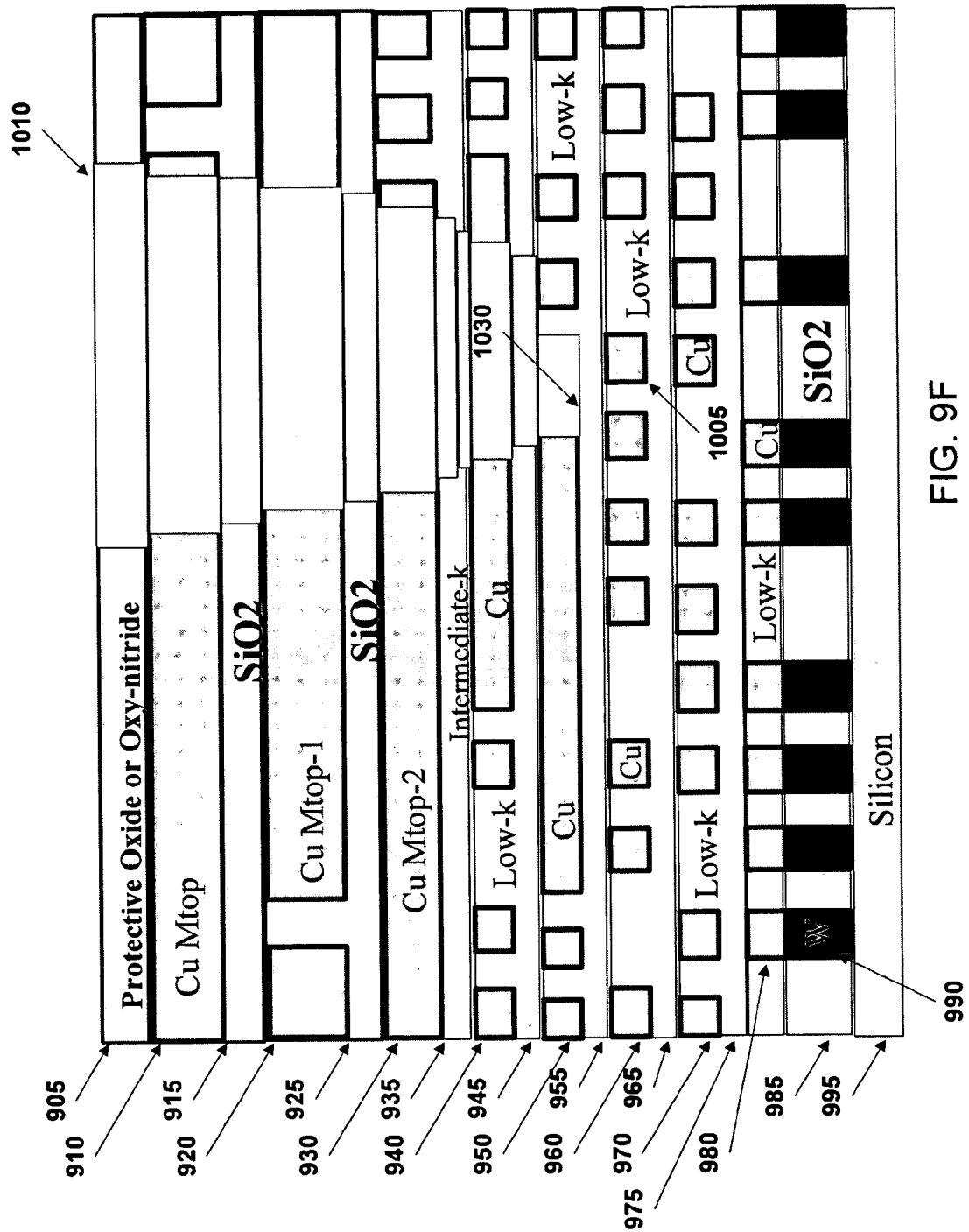

FIG. 9F shows the copper of layer 950 removed at 1030 to expose organic dielectric layer 955.

The next steps in the operation will depend on whether the targeted trace is to be cut or is to be the starting point for depositing a contact. If the operation is to be a cut, a suitable precursor, such as $NH_4OH$ but not $XeF_2$, is used to mill organic dielectric layer 960 to expose copper layer 965.

Figure 9G:
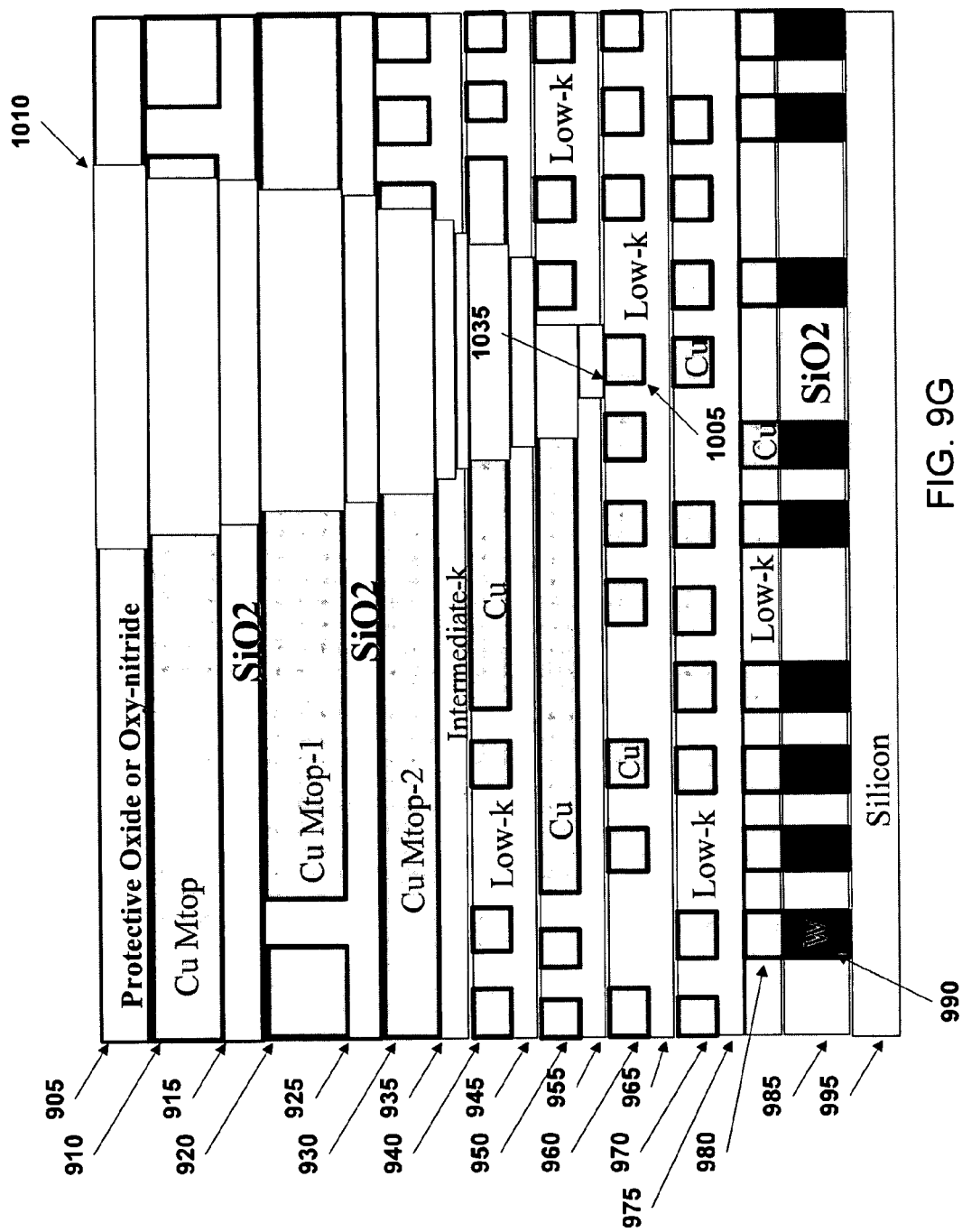

FIG. 9G shows the organic dielectric of layer 955 removed to expose copper trace 1005 of copper layer 960 at 1035. Milling continues using a process in accordance with the invention employing a precursor which enhances removal of copper but which hinders removal of organic dielectric.

Figure 9H:
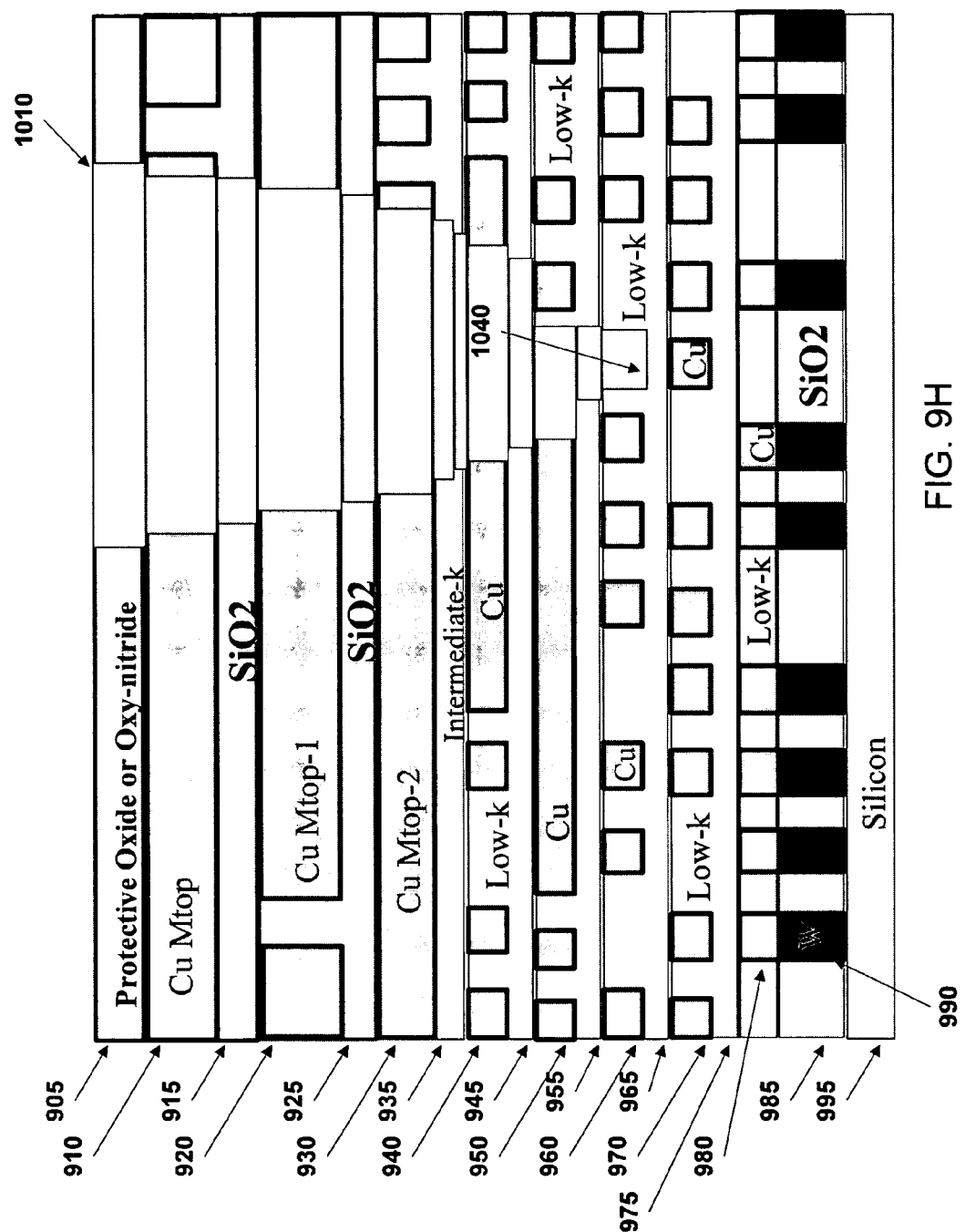

FIG. 9H shows the result of milling through trace 1005 of copper layer 960 to electrically isolate the trace. After cutting through the trace, exposed copper and low-k dielectric are best sealed by FIB deposition of insulator as copper is very susceptible to corrosion and low-k dielectric deteriorates under prolonged exposure to atmosphere. That this deposited insulator be conformal is important.

Figure 9I:
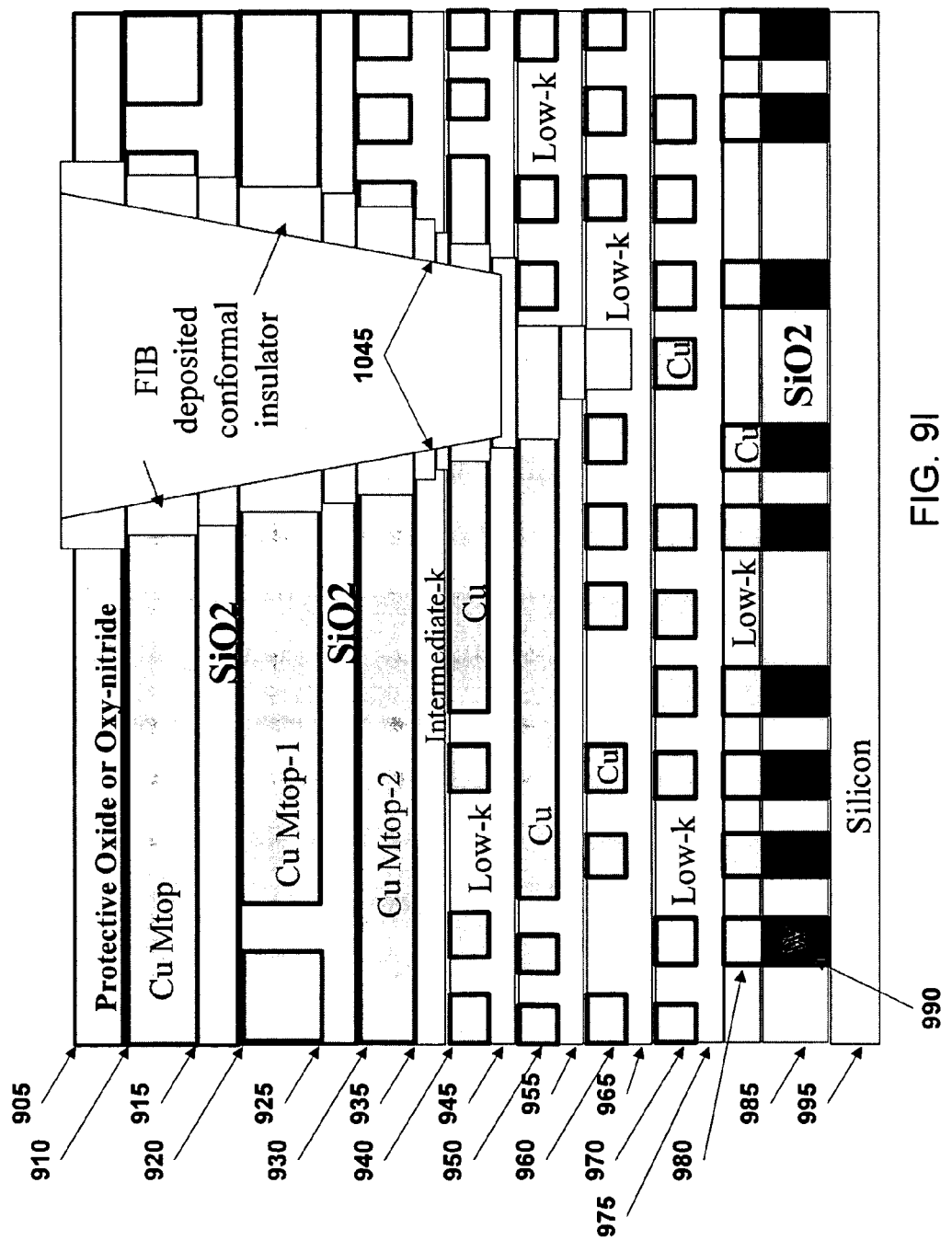

FIG. 9I shows the result of depositing conformal insulator material 1045 to seal exposed copper and dielectric.

If the operation is to be deposition of a contact, trace 1005 is left intact, conformal insulator material 1045 is deposited to seal exposed copper and dielectric, and an opening is milled through the deposited insulator material 1045 (with a non-$XeF_2$ precursor) to expose trace 1005 at indicated at 1050. Upon exposure, the copper should be etched so that copper redeposition coats the walls of the opening to help minimize resistance of the deposited insulator.

FIG. 9J shows the result of milling through deposited insulator material 1045 to expose copper trace 1005 at 1050.

Figure 9K:
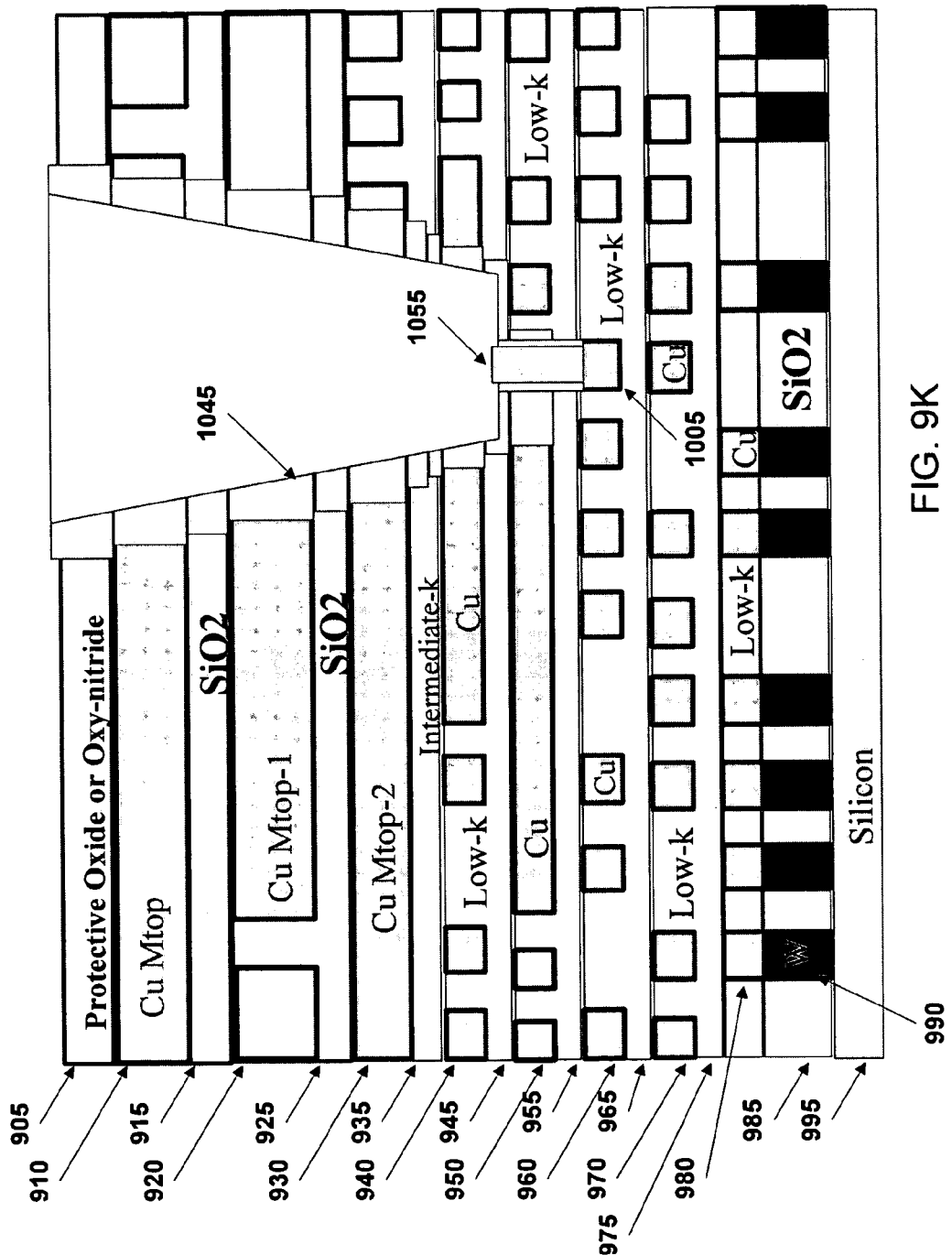

Contact to the targeted trace 1005 is now made by means of FIB deposited conductor as indicated at 1055 in FIG. 9K. Note that the deposit is slightly smaller than the opening width to assure that deposition on the edges do not result in the deposit being pinched off. Certain procedures need to be followed to guarantee minimal resistance; see R. LEE et al., *Low Resistivity FIB Depositions Within High Aspect Ratio Holes*, PROCEEDINGS OF THE 22ND INTERNATIONAL SYMPOSIUM OF TESTING AND FAILURE ANALYSIS, 18–22 Nov. 1996, Los Angeles, Calif., pp. 85–88.

Figure 9L:
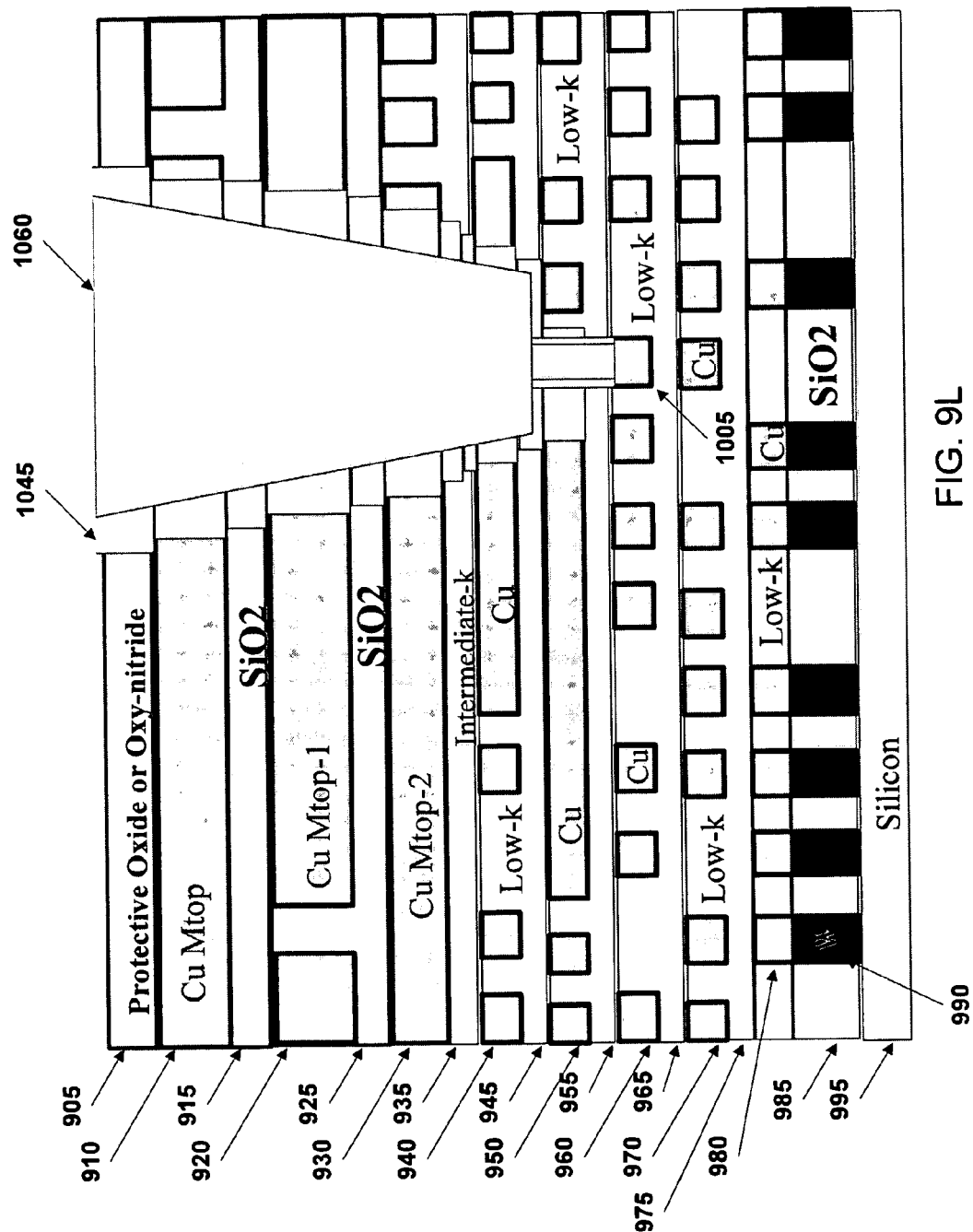

Deposition of conductive material continues so that the contact is brought to the surface as indicated at 1060 in FIG. 9L so that it can be horizontally routed elsewhere as per the edit design. While FIG. 9L shows a probe point suitable for electrical measurements, the edit can be completed in a manner most expeditious to what is required.

Many combinations of features in accordance with this Detailed Description are intended to be within the scope of the invention, including but not limited to the following:

1. A process for milling copper adjacent to organic dielectric on a substrate, comprising:
    a. Directing a charged-particle beam at a portion of the copper; and
    b. Exposing the copper to a precursor sufficient to enhance removal of the copper, wherein the precursor contains an oxidizing agent, has a sticking coefficient greater than than about 0.01 and a residence time longer than about 100 ns on the copper, contains atoms of at least one of carbon and silicon in amount sufficient to stop oxidation of the dielectric.
2. A process of milling copper adjacent to organic dielectric on a substrate, comprising:
    a. Directing a charged-particle beam at a portion of the copper; and
    b. Exposing the copper to a precursor sufficient to enhance removal of the copper, wherein the precursor comprises at least one of the group consisting of NitroEthanol, NitroEthane, NitroPropane, NitroMethane, compounds based on silazane, and compounds based on siloxane.
3. The process of 1 or 2, wherein the precursor contains no atoms of chlorine, bromine or iodine.
4. The process of any of 1–3, wherein the oxidizing agent comprises at least one of oxygen and nitrogen.
5. The process of any of 1–4, wherein the oxidizing agent comprises oxygen atoms in an amount no more than about two times the amount of carbon atoms and silicon atoms.
6. The process of any of 1–5, wherein the oxidizing agent comprises a number of oxidizing-agent atoms, and the atoms of at least one of carbon and silicon is limited to about four times the number of oxidizing-agent atoms.
7. The process of any of 1–6, wherein the precursor comprises a compound having a vapor pressure at room temperature between about 0.01 Torr and 1000 Torr.
8. The process of any of 1–7, wherein the precursor comprises a compound which at room temperature provides a pressure in a working chamber of a FIB instrument of less than about $5 \times 10^{-5}$ Torr.
9. The process of any of 1–8, wherein the precursor comprises a compound which at room temperature provides a pressure in working chamber of a FIB of about $10^{-5}$ Torr.
10. The process of any of 1–9, wherein the charged-particle beam comprises an ion beam having an average current density over a scanned area between about 0.01 pA/µm$^2$ and about 500 pA/µm$^2$.

11. The process of any of 1–10, wherein the precursor is an insulator precursor.

12. The process of any of 1–11, wherein the precursor is not a conductor precursor and wherein fragmentation of the precursor results in at least one volatile.

13. The process of any of 1–12, wherein fragmentation of the precursor produces no electrical conductivity.

14. The process of any of 1–13, wherein the precursor has a residence time on the copper longer than about 10 μsec on the copper.

15. The process of any of 1–14, wherein the precursor has a sticking coefficient greater than than about 0.1.

16. The process of any of 1–15, wherein fragmentation of the precursor results in replacement of a portion of the organic dielectric with another dielectric.

17. The process of any of 1–16, wherein the copper is continuously exposed to the precursor.

18. The process of any of 1–17, wherein the charged-particle beam is continuous.

19. The process of any of 1–17, wherein the charged-particle beam is intermittent.

20. The process of any of 1–19, wherein the precursor has a vapor pressure between about 0.01 Torr and about 1000 Torr in at least a portion of the temperature range between about 0 degrees Celcius and about 100 degrees Celcius.

21. The process of any of 1–20, wherein the precursor has a vapor pressure between about 0.01 Torr and about 1000 Torr in at least a portion of the temperature range between about 10 degrees Celcius and about 60 degrees Celcius.

22. The process of any of 1–21, wherein the precursor has a molecular weight between about 2 and about 500.

23. The process of any of 1–22, wherein the precursor is volatile at temperatures above about 30 degrees Celcius.

24. The process of any of 1 or 3–23, wherein the precursor comprises at least one of the group consisting of NitroEthanol, NitroEthane, NitroPropane, NitroMethane, compounds based on silazane, and compounds based on siloxane.

25. The process of 2 or 24, wherein the compounds based on silazane include Hexa-Methyl Cyclo-Tri-Silazane.

26. The process of any of 1–25, wherein the precursor comprises Hexa-Methyl Cyclo-Tri-Silazane.

27. The process of any of 1–25, wherein the precursor comprises at least one of the group consisting of compounds based on siloxane.

28. The process of any of 1–26, wherein the precursor comprises at least one of the group consisting of cyclosiloxane compounds.

29. The process of any of 1–27, wherein the precursor comprises Octa-Methyl-Cyclo-Tetra-Siloxane.

30. An article having copper adjacent to organic dielectric on a substrate, the copper having a surface treated in accordance with the process of any one of 1–29.

31. Apparatus for milling copper adjacent to organic dielectric on a substrate, comprising:
    a. A charged-particle beam source for directing a charged-particle beam at a portion of the copper; and
    b. A precursor source for exposing the copper to a precursor sufficient to enhance removal of the copper, wherein the precursor is as provided in any of 1–29.

Those of skill in the art will recognize that these and other modifications can be made within the spirit and scope of the invention.

The invention claimed is:

1. A process for milling copper adjacent to organic dielectric on a substrate, comprising:
    a. Directing a charged-particle beam at a portion of the copper; and
    b. Exposing the copper to a precursor sufficient to enhance removal of the copper, wherein the precursor contains an oxidizing agent, has a sticking coefficient greater than about 0.01 and a residence time longer than about 100 ns on the copper, and the precursor contains atoms of at least one of carbon and silicon in amount sufficient to stop oxidation of the dielectric.

2. The process of claim 1, wherein the precursor contains no atoms of chlorine, bromine or iodine.

3. The process of claim 2, wherein the oxidizing agent comprises at least one of oxygen and nitrogen.

4. The process of claim 1, wherein the oxidizing agent is oxygen.

5. The process of claim 1, wherein the oxidizing agent is nitrogen.

6. The process of claim 1, wherein the oxidizing agent comprises oxygen atoms in an amount no more than about two times the amount of carbon atoms and silicon atoms.

7. The process of claim 1, wherein the oxidizing agent comprises a number of oxidizing-agent atoms, and the atoms of at least one of carbon and silicon is limited to about four times the number of oxidizing-agent atoms.

8. The process of claim 2, wherein the oxidizing agent comprises oxygen atoms in an amount no more than about two times the amount of carbon atoms and silicon atoms.

9. The process of claim 2, wherein the oxidizing agent comprises a number of oxidizing-agent atoms, and the atoms of at least one of carbon and silicon is limited to about four times the number of oxidizing-agent atoms.

10. The process of claim 1, wherein the precursor comprises a compound having a vapor pressure at room temperature between about 0.01 Torr and 1000 Torr.

11. The process of claim 1, wherein the precursor comprises a compound which at room temperature provides a pressure in a working chamber of a FIB instrument of less than about $5 \times 10^{-5}$ Torr.

12. The process of claim 1, wherein the precursor comprises a compound which at room temperature provides a pressure in working chamber of a FIB of about $10^{-5}$ Torr.

13. The process of claim 1, wherein the charged-particle beam comprises an ion beam having an average current density over a scanned area between about 0.01 pA/μm$^2$ and about 500 pA/μm$^2$.

14. The process of claim 1, wherein the precursor is an insulator precursor.

15. The process of claim 1, wherein the precursor is not a conductor precursor and wherein fragmentation of the precursor results in at least one volatile.

16. The process of claim 1, wherein fragmentation of the precursor produces no electrical conductivity.

17. The process of claim 1, wherein the precursor has a residence time on the copper longer than about 10 μsec on the copper.

18. The process of claim 1, wherein the precursor has a sticking coefficient greater than about 0.1.

19. The process of claim 1, wherein fragmentation of the precursor results in replacement of a portion of the organic dielectric with another dielectric.

20. The process of claim 1, wherein the copper is continuously exposed to the precursor.

21. The process of claim 20, wherein the charged-particle beam is continuous.

22. The process of claim 20, wherein the charged-particle beam is intermittent.

23. The process of claim 1, wherein the copper is intermittently exposed to the precursor.

24. The process of claim 23, wherein the charged-particle beam is continuous.

25. The process of claim 23, wherein the charged-particle beam is intermittent.

26. The process of claim 1, wherein the precursor has a vapor pressure between about 0.01 Torr and about 1000 Torr in at least a portion of the temperature range between about 0 degrees Celsius and about 100 degrees Celsius.

27. The process of claim 1, wherein the precursor has a vapor pressure between about 0.01 Torr and about 1000 Torr in at least a portion of the temperature range between about 10 degrees Celcius and about 60 degrees Celcius.

28. The process of claim 1, wherein the precursor has a molecular weight between about 2 and about 500.

29. The process of claim 1, wherein the precursor is volatile at temperatures above about 30 degrees Celsius.

30. The process of claim 1, wherein the precursor comprises at least one of the group consisting of NitroEthanol, NitroEthane, NitroPropane, NitroMethane, compounds based on silazane, and compounds based on siloxane.

31. The process of claim 30, wherein the compounds based on silazane include Hexa-Methyl Cyclo-Tri-Silazane.

32. The process of claim 1, wherein the precursor comprises at least one of the group consisting of compounds based on silazane.

33. The process of claim 1, wherein the precursor comprises Hexa-Methyl Cyclo-Tri-Silazane.

34. The process of claim 1, wherein the precursor comprises at least one of the group consisting of compounds based on siloxane.

35. The process of claim 1, wherein the precursor comprises at least one of the group consisting of cyclosiloxane compounds.

36. The process of claim 1, wherein the precursor comprises Octa-Methyl-Cyclo-Tetra-Siloxane.

37. A process of milling copper adjacent to organic dielectric on a substrate, comprising:
  a. Directing a charged-particle beam at a portion of the copper; and
  b. Exposing the copper to a precursor sufficient to enhance removal of the copper, wherein the precursor comprises at least one of the group consisting of NitroEthanol, NitroEthane, NitroPropane, NitroMethane, and compounds based on silazane.

38. The process of claim 37, wherein the compounds based on silazane include Hexa-Methyl Cyclo-Tri-Silazane.

39. The process of claim 37, wherein the precursor comprises a compound having a vapor pressure at room temperature between about 0.01 Torr and about 1000 Torr.

40. The process of claim 37, wherein the charged-particle beam comprises an ion beam having an average current density over scanned area between about 0.01 $pA/\mu m^2$ and about 500 $pA/\mu m^2$.

41. The process of claim 37, wherein the copper is continuously exposed to the precursor.

42. The process of claim 41, wherein the charged-particle beam is continuous.

43. The process of claim 41, wherein the charged-particle beam is intermittent.

44. The process of claim 37, wherein the copper is intermittently exposed to the precursor.

45. The process of claim 44, wherein the charged-particle beam is continuous.

46. The process of claim 44, wherein the charged-particle beam is intermittent.

47. The process of claim 37, wherein the precursor has a vapor pressure between about 0.01 Torr and about 1000 Torr in at least a portion of the temperature range between about 10 degrees Celsius and about 60 degrees Celsius.

48. The process of claim 37, wherein the precursor has a molecular weight between about 2 and about 500.

49. The process of claim 37, wherein the precursor is volatile at temperatures above about 30 degrees Celsius.

* * * * *